United States Patent
Ilani et al.

(10) Patent No.: US 10,536,172 B2
(45) Date of Patent: Jan. 14, 2020

(54) ECC AND RAID-TYPE DECODING

(71) Applicant: WESTERN DIGITAL TECHNOLOGIES, INC., San Jose, CA (US)

(72) Inventors: Ishai Ilani, Dolev (IL); Idan Alrod, Herzliya (IL); Eran Sharon, Rishon Lezion (IL); Mai Ghaly, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 131 days.

(21) Appl. No.: 15/817,535

(22) Filed: Nov. 20, 2017

(65) Prior Publication Data

US 2018/0091172 A1   Mar. 29, 2018

Related U.S. Application Data

(63) Continuation-in-part of application No. 15/177,822, filed on Jun. 9, 2016, now Pat. No. 9,959,168.

(60) Provisional application No. 62/303,844, filed on Mar. 4, 2016.

(51) Int. Cl.
| | |
|---|---|
| H03M 13/29 | (2006.01) |
| H03M 13/37 | (2006.01) |
| G06F 3/06 | (2006.01) |
| G06F 11/10 | (2006.01) |
| H03M 13/15 | (2006.01) |

(52) U.S. Cl.
CPC ........ *H03M 13/2927* (2013.01); *G06F 3/064* (2013.01); *G06F 3/0619* (2013.01); *G06F 3/0689* (2013.01); *G06F 11/1068* (2013.01); *G06F 11/1076* (2013.01); *H03M 13/373* (2013.01); *H03M 13/152* (2013.01)

(58) Field of Classification Search
CPC .................................................... G06F 11/1076
USPC ........................................ 714/764, 767, 770
See application file for complete search history.

(56) References Cited

U.S. PATENT DOCUMENTS

| | | | | |
|---|---|---|---|---|
| 4,428,047 | A | * | 1/1984 | Hayn .................... G06F 9/4825 712/230 |
| 5,111,463 | A | | 5/1992 | Zook |
| 5,751,733 | A | | 5/1998 | Glover |
| 5,844,919 | A | | 12/1998 | Glover et al. |
| 7,823,043 | B2 | | 10/2010 | Lasser |
| 8,375,274 | B1 | | 2/2013 | Bonke |
| 8,484,533 | B2 | | 7/2013 | Olbrich et al. |
| 8,788,910 | B1 | | 7/2014 | Northcott |
| 9,268,635 | B2 | | 2/2016 | Sharon et al. |
| 9,354,975 | B2 | | 5/2016 | Aliev et al. |

(Continued)

*Primary Examiner* — Fritz Alphonse
(74) *Attorney, Agent, or Firm* — Michael Best & Friedrich LLP

(57) ABSTRACT

A device includes a memory and a controller coupled to the memory. The controller is configured to read a codeword from a physical location of the memory. The controller is configured to write an inverse bit string to the physical location of the memory, the inverse bit string based on the codeword. The controller is configured to read a representation of the inverse bit string from the physical location of the memory. The controller is further configured to designate one or more bits of the codeword as one or more erased bits based on the codeword and the representation of the inverse bit string.

20 Claims, 9 Drawing Sheets

(56) References Cited

U.S. PATENT DOCUMENTS

| | | |
|---|---|---|
| 2002/0181944 A1* | 12/2002 | Kawahara .............. G11B 15/07 |
| | | 386/326 |
| 2003/0070042 A1 | 4/2003 | Byrd et al. |
| 2006/0150010 A1* | 7/2006 | Stiffler ................ G06F 11/1438 |
| | | 714/13 |
| 2007/0214316 A1 | 9/2007 | Kim |
| 2012/0221926 A1 | 8/2012 | Blaum et al. |
| 2013/0042053 A1 | 2/2013 | Huang |
| 2015/0046767 A1 | 2/2015 | Cideciyan et al. |
| 2015/0143027 A1 | 5/2015 | Luo et al. |
| 2015/0205668 A1 | 7/2015 | Sundaram et al. |
| 2015/0339187 A1 | 11/2015 | Sharon et al. |
| 2016/0373137 A1 | 12/2016 | Zhang et al. |
| 2017/0109079 A1* | 4/2017 | Pelley .................... G06F 3/0613 |
| 2017/0123901 A1* | 5/2017 | Zhao ...................... G11C 29/52 |

\* cited by examiner

ECC AND RAID-TYPE DECODING

CROSS-REFERENCE TO RELATED APPLICATIONS

The present application claims priority from and is a continuation-in-part of U.S. patent application Ser. No. 15/177,822, filed on Jun. 9, 2016, which claims benefit of U.S. Provisional Application No. 62/303,844, filed Mar. 4, 2016. The contents of each of these applications are incorporated by reference herein in their entirety.

FIELD OF THE DISCLOSURE

This disclosure is generally related to data storage devices and more particularly to data encoding and recovery using error correction coding (ECC) techniques and redundant array of independent disks (RAID)-type techniques.

BACKGROUND

Non-volatile data storage devices, such as flash solid state drive (SSD) memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g., "parity bits") that may be stored with the data as an ECC codeword. As more parity bits are used, an error correction capacity of the ECC increases and a number of bits required to store the encoded data also increases. Using a sufficient number of parity bits to provide "worst-case" error correction capability for all data stored in a memory device reduces the storage density of the memory device in order to protect against an amount of data corruption that is statistically unlikely to occur before the memory device reaches the end of its useful life.

SSD devices may also incorporate a redundant array of independent dies (RAID)-type storage scheme that may use parity bits to enable data recovery in case of memory defects and device failures, which cannot be recovered by the ECC which is aimed at handling random errors (e.g., due to program disturb, read disturb, charge loss due to data retention, etc.). ECC may not be able to recover the data in case of memory defects or complete failure, which may result in very high error rates that exceed the ECC capability. Hence, additional RAID-type protection may be required for protecting against such memory defects. For example, a RAID 6 storage scheme may distribute data, a first parity for the data, and a second parity for the data in a "stripe" across multiple non-volatile memories (e.g., across multiple SSDs or across multiple NAND flash memories in a single SSD). The first parity (or the second parity) may enable recovery of the data in the stripe in case of erasures due to failure of one of the data-storing non-volatile memories, and the first parity and the second parity together may enable recovery of the data in the stripe in case of erasures due to failure of two of the data-storing non-volatile memories. However, data in such storage schemes may not be recoverable if three or more of the data-storing non-volatile memories fail. Note that although the name RAID may suggest that RAID parity is stored in a redundant die, this is not mandatory. In some cases, a redundant plane, redundant block or redundant word lines (WLs) or pages within a block may be used for storing the RAID parity. For example, the RAID stripe may be implemented across dies, planes, blocks or pages within a block of the non-volatile memory.

The two protection levels, ECC for random errors and RAID for memory defects and failures, may require memory overprovisioning for storing the ECC and RAID parity.

Additionally, as memory technologies change, there is a drive to improve latency between a memory and a controller (or between a data storage device and an access device). One way to improve latency is to reduce the amount of data transferred between the controller and the memory, such as by using an ECC scheme with fewer parity bits. However, reducing the number of parity bits may reduce the error correcting capacity of the ECC scheme.

DETAILED DESCRIPTION

Figure 1:
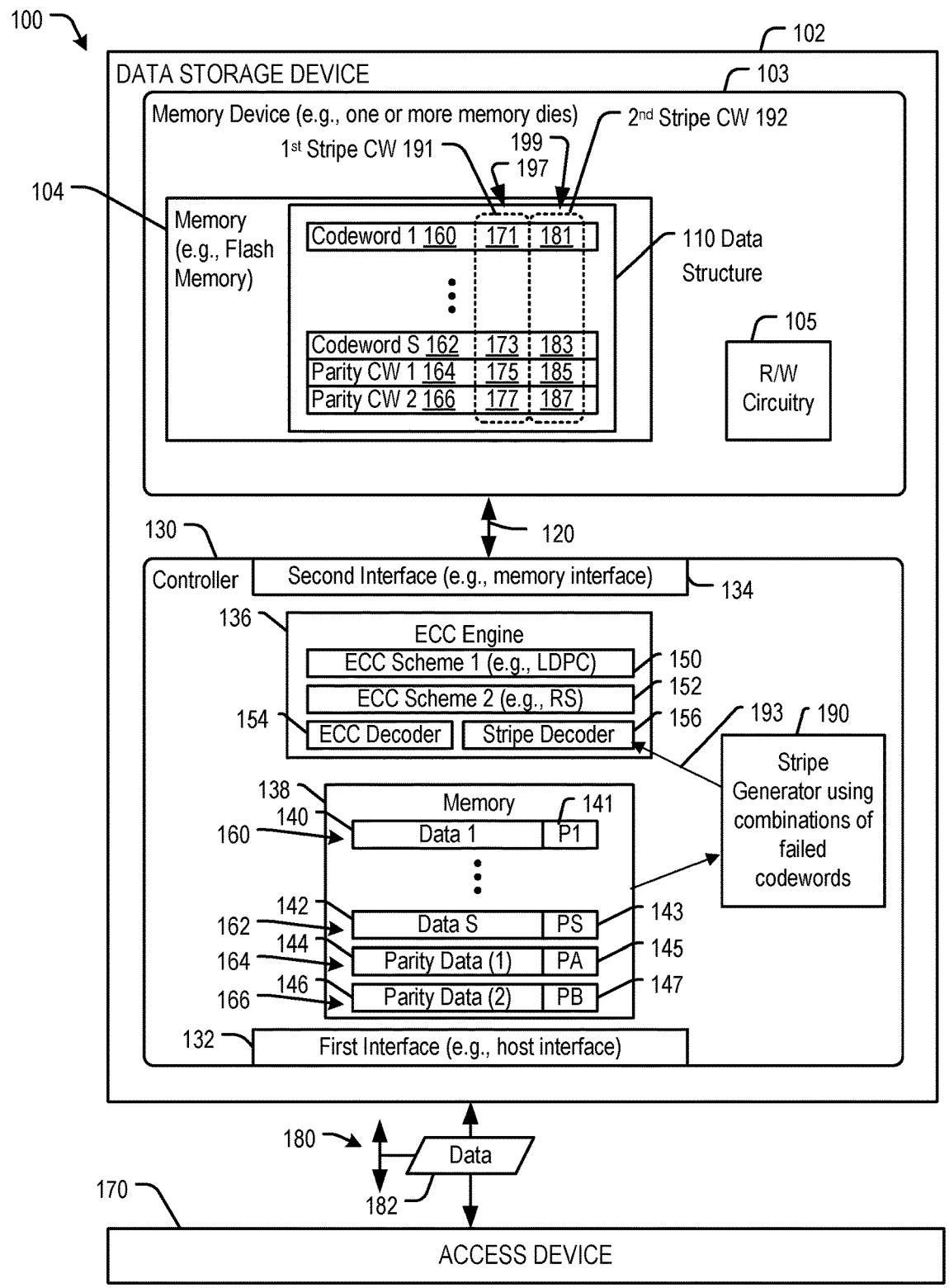
FIG. 1 is a block diagram of an example of a system including a data storage device including an ECC engine configured to decode data using ECC techniques and RAID-type techniques.

A data storage device is configured to perform error correction code (ECC) and RAID-type decoding. Memory overprovisioning may be used for storing the ECC and RAID parity to provide the two protection levels: ECC for random errors and RAID for memory defects and failures. In order to efficiently utilize the allocated overprovisioning and to improve or maximize the random error correction capability given the overall allocated overprovisioning, joint ECC and RAID decoding can be performed, leveraging the unused RAID overprovisioning for random error correction, whenever there are no memory defects or when the number memory defects is less than the RAID correction capability.

The data storage device may include a controller coupled to a memory. The memory may store a data structure including a plurality of codewords. The data structure may also include parity codewords. Each of the codewords may be stored at separate pages of the memory. The data structure may be configured to enable each of the codewords to be decodable independently of the other codewords. Portions of the codewords may correspond to multiple stripes of the data structure. For example, first portions of the codewords may correspond to a first stripe of the data structure and second portions of the codewords may correspond to a second stripe of the data structure.

The controller may read the codewords from the memory. The codewords may include a number of undecodable codewords that are undecodable at an ECC decoder according to a first correction scheme (e.g., a low-density parity check (LDPC) scheme). The ECC decoder may generate trial data for a stripe of the data structure such that at least one of the undecodable codewords corresponds to erased data of the stripe and at least another of the undecodable codewords corresponds to valid data of the stripe. The ECC decoder may initiate a stripe decode operation of the trial data using a stripe correction scheme. The ECC decoder may, for each undecoded stripe of the data structure, test different combinations of the undecodable codewords as erased data until the stripe is decoded or until all distinct combinations of the undecodable codewords as erased data have been tested.

Also in accordance with the present disclosure, a data storage device is configured to designate erased bits of a codeword and perform an erasure decoding/correction of the codeword (and additional codewords) based on the designated erased bits. As used herein, "codeword" refers to decodable codewords and undecodable codewords (e.g., codewords having one or more errors that may prevent successful decoding until the one or more errors are corrected). The data storage device may include a storage-class memory, and the erased bits may be determined based on a comparison of the codeword to a retrieved inverse bit string that is read from the same physical location in the memory. To illustrate, after reading the codeword from the memory, an inverse bit string is written to the same physical location (e.g., the inverse bit string overwrites the codeword at the physical location of the memory). The retrieved inverse bit string is a representation of the inverse bit string that is read from the memory; however, one or more bits may be different than the inverse bit string due to errors or defects (e.g., "stuck bits") in the memory. An exclusive-or (XOR) operation may be performed on the codeword and the retrieved inverse bit string to determine one or more bits that have the same value, and the one or more bits are designated as the erased bits. A decoding operation (e.g., an erasure decoding/correction operation) may be performed based on the erased bits to decode the codeword and to decode a modified codeword that is generated by inverting (e.g., complementing) the values of the erased bits of the codeword. The modified codeword may have fewer errors than the codeword, and thus may be decodable. Additionally, or alternatively, the codeword may be modified based on a combination of other codewords and parity data (e.g., a XOR stripe), and the codeword (after modification) may be decoded. For example, one or more bits of the codeword may be replaced by one or more bits of a reconstructed codeword (e.g., a result of a XOR operation on the other codewords and the parity data) based on reliability information associated with the reconstructed codeword. Modifying the codeword may be part of an iterative process to modify (e.g., correct) undecodable codewords such that a target codeword may become decodable by an ECC decoder or a stripe decoder.

In an illustrative implementation, the data storage device includes a memory and a controller coupled to the memory. The controller is configured to read a codeword from a physical location of the memory. For example, the controller may read the codeword from a particular physical address (or address range). The controller is configured to write an inverse bit string to the physical location of the memory. In some implementations, the controller is configured to invert the value of each bit of the codeword to generate the inverse bit string, and the controller overwrites the codeword at the memory with the inverse bit string. In an illustrative implementation, the controller is configured to read a representation of the inverse bit string (e.g., a retrieved inverse bit string) from the physical location of the memory. In an illustrative implementation, the controller is further configured to designate one or more bits of the codeword as one or more erased bits based on the codeword and the retrieved inverse bit string. For example, a XOR operation may be performed based on the codeword and the retrieved inverse bit string, and one or more bits that have the same value in the codeword and the retrieved inverse bit string may be designated as the one or more erased bits. In an illustrative implementation, an erasure decoding/correction is performed based on the one or more erased bits to decode the codeword and based on a modified codeword (e.g., a codeword generating by modifying the values of the one or more erased bits in the codeword).

Particular examples in accordance with the disclosure are described below with reference to the drawings. In the description, common features are designated by common reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identification and ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

FIG. 1 depicts an illustrative example of a system 100 that includes a data storage device 102 and an access device 170 (e.g., a host device or another device). The data storage device 102 includes an ECC engine 136 that is configured to encode stripes of a data structure 110 and to decode data of the data structure 110 according to a first correction scheme 150 (e.g., a LDPC correction scheme) and a second correction scheme 152 (e.g., a stripe correction scheme). If a number of rows (e.g., LDPC codewords) of the data structure 110 that are uncorrectable using the first correction scheme 150 exceeds an erasure correction capability of the second correction scheme 152, multiple trials of stripe decoding may be performed for each stripe of the data structure 110 by selecting different combinations of the uncorrectable rows as representing erased data of the stripe or as representing valid data of the stripe. As a result, one or more stripes of the data structure 110 may be decoded even though the erasure correction capacity is exceeded.

The data storage device 102 and the access device 170 may be coupled via a connection (e.g., a communication path 180), such as a bus or a wireless connection. The data storage device 102 may include a first interface 132 (e.g., an access device or host interface) that enables communication via the communication path 180 between the data storage device 102 and the access device 170.

The data storage device 102 may include or correspond to a solid state drive (SSD) which may be included in, or distinct from (and accessible to), the access device 170. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 170 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

In some implementations, the data storage device 102 may be embedded within the access device 170, such as in accordance with a Joint Electron Devices Engineering Council (JEDEC) Solid State Technology Association Universal Flash Storage (UFS) configuration. For example, the data storage device 102 may be configured to be coupled to the access device 170 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 170 (i.e., "removably" coupled to the access device 170). As an example, the data storage device 102 may be removably coupled to the access device 170 in accordance with a removable universal serial bus (USB) configuration.

The data storage device 102 may operate in compliance with an industry specification. For example, the data storage device 102 may include a SSD and may be configured to communicate with the access device 170 using a small computer system interface (SCSI)-type protocol, such as a serial attached SCSI (SAS) protocol. As other examples, the data storage device 102 may be configured to communicate with the access device 170 using a NVM Express (NVMe) protocol or a serial advanced technology attachment (SATA) protocol. In other examples, the data storage device 102 may operate in compliance with a JEDEC eMMC specification, a JEDEC Universal Flash Storage (UFS) specification, one or more other specifications, or a combination thereof, and may be configured to communicate using one or more protocols, such as an eMMC protocol, a universal flash storage (UFS) protocol, a universal serial bus (USB) protocol, and/or another protocol, as illustrative, non-limiting examples.

The access device 170 may include a memory interface (not shown) and may be configured to communicate with the data storage device 102 via the memory interface to read data from and write data to the memory device 103 of the data storage device 102. For example, the access device 170 may be configured to communicate with the data storage device 102 using a SAS, SATA, or NVMe protocol. As other examples, the access device 170 may operate in compliance with a Joint Electron Devices Engineering Council (JEDEC) industry specification, such as a Universal Flash Storage (UFS) Access Controller Interface specification. The access device 170 may communicate with the memory device 103 in accordance with any other suitable communication protocol.

The access device 170 may include a processor and a memory. The memory may be configured to store data and/or instructions that may be executable by the processor. The memory may be a single memory or may include multiple memories, such as one or more non-volatile memories, one or more volatile memories, or a combination thereof. The access device 170 may issue one or more commands to the data storage device 102, such as one or more requests to erase data, read data from, or write data to the memory device 103 of the data storage device 102. For example, the access device 170 may be configured to provide data, such as data 182, to be stored at the memory device 103 or to request data to be read from the memory device 103. The access device 170 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

Although the data storage device 102 is illustrated as including the memory device 103, in other implementations the data storage device 102 may include multiple memory devices that may be configured in a similar manner as described with respect to the memory device 103. For example, the data storage device 102 may include multiple memory devices, each memory device including one or more packages of memory dies, each package of memory dies including one or more memories such as the memory 104. Data striping and error recovery as described with respect to pages of the memory 104 may be extended to include data striping and error recovery across multiple dies, across multiple packages, across multiple memory devices, or any combination thereof.

The memory 104 may include one or more blocks, such as a NAND flash erase group of storage elements. Each storage element of the memory 104 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write circuitry 105, to support operation of one or more memory dies of the memory device 103. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The memory 104 includes the data structure 110. The data structure 110 includes multiple codewords (e.g., "S" codewords, where S is an integer greater than one), such as a first codeword 160 and one or more additional codewords, including an $S^{th}$ codeword 162. The data structure 110 also includes a first parity codeword 164 on a first page and a second parity codeword 166 on a second page of the memory 104. For example, each of the codewords 160-166 may be stored at separate pages of the memory 104. The data structure 110 is configured to enable each of the codewords 160-166 to be decodable independently of the other codewords 160-166. For example, the first codeword 160 includes parity bits that may be used by the ECC engine 136 to correct bit errors up to the correction capability of the first correction scheme 150. In the event that one or more of the codewords 160-162 contain a number of bit errors that exceeds the correction capability of the first correction scheme 150, one or more of the first parity codeword 164 and the second parity codeword 166 may be used to generate error-corrected data corresponding to one or more stripes of the data structure 110, such as a first stripe codeword 191 corresponding to a first stripe 197 and a second stripe codeword 192 corresponding to a $K^{th}$ stripe 199, where K indicates a number of stripes in the data structure 110 and is an integer greater than one.

To illustrate, the first stripe codeword 191 includes a first portion 171 of the first codeword 160 and a first portion of one or more of the other codewords, including a first portion 173 of the $S^{th}$ codeword 162. The first portions 171-173 of the codewords 160-162 may be encoded using a stripe encoding scheme (e.g., a Reed-Solomon (RS) scheme) to generate first parity data corresponding to the first stripe 197. A first portion 175 of the first parity data corresponding to the first stripe 197 is included in the first parity codeword 164 and a second portion 177 of the first parity data corresponding to the first stripe 197 is included in the second parity codeword 166. The second stripe codeword 192 includes a second portion 181 of the first codeword 160 and a second portion of one or more other codewords of the data structure 110, including a second portion 183 of the $S^{th}$ codeword 162. The second stripe codeword 192 also includes a first portion 185 of second parity data corresponding to the $K^{th}$ stripe 199 and a second portion 187 of the second parity data that corresponds to the $K^{th}$ stripe 199.

The controller 130 is coupled to the memory device 103 via a bus 120, an interface (e.g., interface circuitry, such as a second interface 134), another structure, or a combination thereof. For example, the bus 120 may include one or more channels to enable the controller 130 to communicate with a single memory die of the memory device. As another example, the bus 120 may include multiple distinct channels to enable the controller 130 to communicate with each memory die of the memory device 103 in parallel with, and independently of, communication with other memory dies of the memory device 103.

The controller 130 is configured to receive data and instructions from the access device 170 and to send data to the access device 170. For example, the controller 130 may send data to the access device 170 via the first interface 132, and the controller 130 may receive data from the access device 170 via the first interface 132. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The ECC engine 136 is configured to receive data to be stored to the memory 104 and to generate a codeword. For example, the ECC engine 136 may include an encoder configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 136 may include one or more decoders configured to decode data read from the memory 104 to detect and correct, up to an error correction capability of the ECC scheme, any bit errors that may be present in the data.

For example, the ECC engine 136 may include a first decoder, such as an ECC decoder 154, to decode codewords (e.g., codewords 160-166) according to the first correction scheme 150. The ECC engine 136 may include a second decoder, such as a stripe decoder 156, to correct erasures in the stripe codewords of the data structure 110 (e.g., stripe codewords 191-192) according to the second correction scheme 152. As a non-limiting example, each of the codewords 160-166 may be encoded using a first encoding scheme (e.g., LDPC), each of the stripes 190-192 may be encoded using a second encoding scheme (e.g., Reed Solomon), the first correction scheme 150 may include a LDPC correction scheme, and the second correction scheme 152 may include a Reed Solomon erasure correction scheme. Although LDPC and Reed Solomon are provided as non-limiting examples, each of the codewords 160-166 may be encoded using a different encoding scheme (e.g., a BCH scheme), and each of the stripes 197-199 may be encoded using a different stripe encoding scheme (e.g., another BCH scheme).

The controller 130 is configured to receive the data 182 from the access device 170 and to encode the data 182 into multiple codewords and multiple stripe codewords to generate the data structure 110 to be stored in the memory 104. For example, the controller 130 may be configured to partition the data 182 into S data words. To illustrate, first data 140 may correspond to a first data word of the data 182 and $S^{th}$ data 142 may correspond to a last data word of the data 182. The controller 130 is configured to encode first data 140 to generate a first codeword 160 that is decodable using the first correction scheme 150. To illustrate, the first codeword 160 may include the first data 140 and first parity bits (P1) 141 based on the first data 140. The controller 130 is further configured to encode second data 142 (e.g., the $5^{th}$ data) to generate the second codeword 162 (e.g., the $5^{th}$ codeword). The second codeword 162 includes the second data 142 and also includes second parity bits (e.g., "PS" parity bits for the $5^{th}$ data) 143 based on the second data 142. Although FIG. 1 illustrates two data words 140 and 142 and two codewords 160 and 162, it should be understood that any number of data words and codewords may be used to generate the data structure 110. For example, S may have a value of 2, 3, 4, 16, 32, 128, or any other integer value greater than one.

The first codeword 160 and the second codeword 162 may be stored in a memory 138 (e.g., a random access memory (RAM) within the controller 130 or RAM (e.g., double data rate type 3 (DDR3) synchronous dynamic RAM (SDRAM)) that is coupled to the controller 130) to enable ECC processing on one or more stripes of the data 140-142 to generate stripe parity data. The controller 130 may be configured to cause the ECC engine 136 to encode multiple stripes of data (e.g., stripes 1 to K (or 0 to K−1), corresponding to multiple columns of multiple bits) from each of the S codewords 160-162 to be encoded using the second encoding scheme to generate parity bits for each stripe 197-199. The parity bits for each stripe 197-199 are inserted into a first set of parity data 144 and a second set of parity data 146 at locations corresponding to the respective stripes. For example, the controller 130 is configured to generate first parity data that corresponds to the first stripe codeword 191 by encoding the first portions 171-173 of the codewords 160-162. The controller 130 is further configured to store the first portion 175 of the first parity data corresponding to the first stripe 197 in a first page of the memory 104 and to store the second portion 177 of the first parity data in the second page of the memory 104. Although FIG. 1 illustrates two stripes 197 and 199, it should be understood that any number of stripes may be used. For example, K may have a value of 2, 3, 4, 16, 32, 128, or any other integer value greater than one.

The ECC engine 136 may encode each stripe until the sets of parity data for each stripe have been generated and stored in the memory 138. The ECC engine 136 is configured to encode the first sets of parity data 144 to generate the first parity codeword 164 that includes the first set of parity data 144 and parity bits (PA) 145. The ECC engine 136 is further configured to encode the second set of parity data 146 to generate the second parity codeword 166 that includes the second set of parity data 146 and parity bits (PB) 147.

The controller 130 may be configured to transfer the codewords 160-166 from the memory 138 for storage into the memory 104 of the memory device 103 to form the data structure 110 in the memory 104. For example, the controller 130 may be configured to sequentially write the codewords 160-166 to consecutively-addressed pages of the memory 104 so that the data structure 110 is aligned in a row-and-column format as depicted in FIG. 1, with the codewords 160-166 forming rows and the stripes 197-199 forming columns in the memory 104. However, in other implementations, the codewords 160-166 may not have any particular alignment or physical relationship to each other in the memory 104, and locations of each of the codewords 160-166 of the data structure 110 may be tracked and maintained by the controller 130. For example, the controller 130 may include a table (not shown) that indicates the physical addresses of each of the S codewords 160-162 and the parity codewords 164-166. The controller 130 may populate the table when the data structure 110 is stored to the memory 104 and may update the table if any of the codewords 160-166 change physical addresses, such as due to garbage collection, wear leveling, or one or more other maintenance operations. The controller 130 may access the table to retrieve physical addresses of the codewords 160-166 in response to one or more of the codewords 160-162 being undecodable using the first correction scheme 150.

Bit errors occurring in one or more of the codewords 160-162 read from the memory 104 may exceed an error correction capacity of the ECC decoder 154. As described in further detail with respect to FIG. 2, the ECC engine 136 may read the remaining codewords of the data structure 110 from the memory 104 to the memory 138 and may attempt decoding of the remaining codewords at the ECC decoder 154. If a number of failed codewords (e.g., that are undecodable at the ECC decoder 154 due to too many errors) is less than or equal to an erasure correction capability of the stripe decoder 156, then the stripe decoder 156 may be used to correct each stripe, thereby correcting the failed codewords. However, if the number of failed codewords exceeds the erasure correction capability of the stripe decoder 156, then the stripe generator 190 may be used to generate one or more trial versions 193 of one or more of the stripes by selecting different combinations of the failed codewords as corresponding to either valid data or erased data, as explained in further detail with reference to FIGS. 2-3.

Because the data structure 110 includes the sets of stripe parity bits generated by the ECC engine 136, and because the stripe generator 190 may be used to perform stripe correction that exceeds an erasure capability of the stripe decoder 156, additional error correction capability is provided for the codewords 160-162 beyond the error correction capability provided by the codeword parity (e.g., parity P1 141 and P2 143). The codewords 160-162 may therefore be formed using fewer parity bits than would otherwise be required for "worst-case" error handling, reducing power consumption during decoding of the codewords 160-162.

Figure 2:
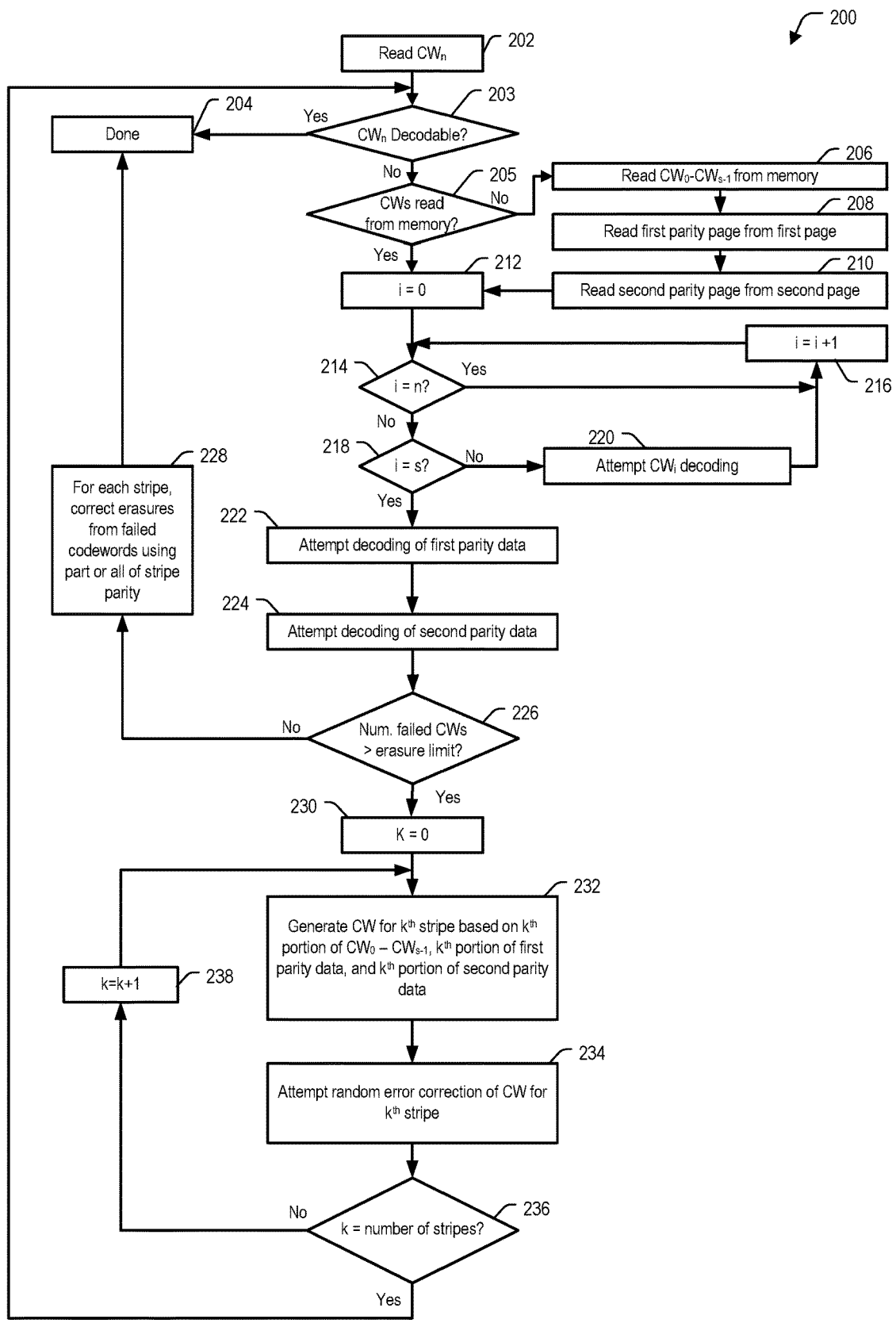
FIG. 2 is a flow diagram of a particular example of a method of decoding data that may be performed by the data storage device of FIG. 1.

Referring to FIG. 2, a particular implementation of a method 200 that may be performed by the controller 130 of the data storage device 102 of FIG. 1 is depicted. Although the method 200 is described with reference to the data storage device 102 of FIG. 1, in other implementations the method 200 may be performed by a device other than the data storage device 102 of FIG. 1.

The method 200 may be used in response to a request to read a particular codeword, $CW_n$. The method 200 includes reading $CW_n$ from the memory 104, at 202. For example, $CW_n$ may correspond to the first codeword 160 of FIG. 1. A determination may be made, at 203, as to whether $CW_n$ is decodable. For example, the controller 130 may route the representation of the first codeword 160 that is read from the memory 104 to the ECC engine 136 to initiate decoding according to the first correction scheme 150. In response to detecting that the $CW_n$ is decodable, an error corrected version of the data of $CW_n$ may be provided to the requestor, such as the access device 170 of FIG. 1, and the method 200 may end, at 204.

In response to determining that $CW_n$ is not decodable, a determination may be made whether the remaining codewords of the data structure 110 have been read from the memory 104, at 205. If the remaining codewords have been read from the memory, a loop counter "i" is initialized (e.g., i=0), at 212. Otherwise, if the remaining codewords of the data structure 110 have not been read from the memory 104, the remaining codewords of the data structure 110 may be read from the memory 104, at 206. The remaining codewords are designated as codewords $CW_0$-$CW_{S-1}$, where S indicates the number of non-parity codewords in the data structure 110. The codewords that are read from the memory 104 may be stored at a memory of the controller 130, such as the memory 138, for access by the ECC engine 136 during decode operations. Alternatively, one or more of the codewords may be retrieved from the memory 104 on an as-needed basis, such as if the memory 138 does not have sufficient capacity to store all of the codewords $CW_0$-$CW_{S-1}$. A first parity page (e.g., the first parity codeword 164 of FIG. 1) may be read from a first page of the memory 104, such as a flash memory, at 208, and a second parity page, such as the second parity codeword 166 of FIG. 1, may be read from a second page of the memory 104, at 210. Processing continues with setting the loop counter "i" to the initial value (e.g., 0), at 212.

A determination is made whether i=n, at 214. If i=n, then i is incremented, at 216. In response to determining that i is not equal to n, at 214, a determination is made whether i is equal to S, at 218. In response to determining that i is not equal to S, at 218, the controller 130 may attempt to decode the $i^{th}$ codeword ($CW_i$), at 220. For example, attempting to decode $CW_i$ may include determining whether $CW_i$ has been decoded, and if $CW_i$ has not been decoded, providing a representation of the $i^{th}$ codeword to the ECC engine 136 to perform a decode operation according to the first correction scheme 150. After attempting to decode $CW_i$, i is incremented, at 216.

When i=S, at 218, a decoding operation has been attempted for each of the (non-parity) codewords of the data structure 110. The controller 130 then attempts decoding of the first parity data, at 222. For example, if the first parity codeword 164 has not been decoded, the controller 130 may provide the first parity codeword 164 that is read from the memory 104 to the ECC engine 136 to attempt to decode the first parity codeword 164. The controller 130 also attempts decoding of the second parity data, at 224. For example, if the second parity codeword 166 has not been decoded, the controller 130 may provide the representation of the second parity codeword 166 that is read from the memory 104 to the ECC engine 136. The ECC engine 136 attempts a decoding operation to detect and correct errors in the second parity codeword 166 according to the first correction scheme 150.

After decode processing of each of the undecoded codewords 160-166 of the data structure 110, a number of undecoded codewords of the codewords $CW_1$-$CW_S$, the first parity data codeword, and the second parity data codeword is compared to an erasure correction capacity of the second correction scheme 152 of FIG. 1, at 226. In response to the number of undecoded codewords not exceeding the erasure correction capacity, each stripe is processed to correct erasures from the undecoded codewords using a portion or all of the stripe parity for the stripe, at 228. For example, if a single codeword (e.g., the first codeword 160 of FIG. 1) is undecoded, the first portion 175 or the second portion 177 of the stripe parity for the first stripe codeword 191 of FIG. 1 may be used to determine the first portion 171 of the first codeword 160. After erasure correction of each stripe, the error corrected version of the data of $CW_n$ may be provided to the requestor, such as the access device 170 of FIG. 1, and the method 200 may end, at 204.

Otherwise, if the number of undecoded codewords exceeds the erasure correction capacity, at 226, one or more trial codewords for each stripe may be generated using combinations of the failed codewords as erasure data and are processed using second correction scheme 152 to perform random error correction in a stripe-by-stripe, row-by-row iterative decoding process. To illustrate, another loop counter "k" is initialized to an initial value, e.g., k=0, at 230. The loop counter k may indicate a stripe index of stripes of the data structure 110. For example, the first stripe 197 may correspond to k=0, the second stripe 199 may correspond to k=1, etc. If the $k^{th}$ stripe is decodable using the stripe decoder 156 (e.g., if the stripe decoder 156 can correct up to Z erasures or Z/2 errors in a stripe, and the $k^{th}$ stripe has Z/2 or fewer errors), then the errors in the $k^{th}$ stripe are corrected by the stripe decoder 156. Otherwise, one or more trial codewords for the $k^{th}$ stripe may be generated based on the $k^{th}$ portion of each of the codewords $CW_0$-$CW_{S-1}$, the $k^{th}$ portion of the first parity data, and the $k^{th}$ portion of the second parity data, using different combinations of the failed codewords as erased data, at 232.

To illustrate, if the number of failed codewords is three (e.g., $CW_1$, $CW_S$, and Parity $CW_1$), and the erasure correction capability is two, three trial versions of the first stripe codeword 191 of FIG. 1 may be generated for the first stripe 197 based on the first portions of each of the codewords 160-162 and the first portion 175 and the second portion 177 of the first parity data. In trial data corresponding to a first trial stripe codeword, the first portion of $CW_1$ may be included as valid data but the first portion of $CW_S$ and Parity $CW_1$ may be omitted or designated as erased data. In trial data corresponding to a second trial stripe codeword, the first portion of $CW_S$ may be included as valid data but the first portion of $CW_1$ and Parity $CW_1$ may be omitted or designated as erased data. In trial data corresponding to a third trial stripe codeword, the first portion of Parity $CW_1$ may be included as valid data but the first portion of $CW_1$ and $CW_S$ may be omitted or designated as erased data. Thus, multiple trial stripe codewords generated using different combinations of the failed codewords taken Z at a time, where Z is the erasure correction capability of the second correction scheme 152, may be attempted for each stripe. Because portions of failed codewords may be error-free, one or more of the trial versions of each of the stripes may be decodable (if a total number of erroneous symbols in the stripe is less than or equal to Z). An example of a method of stripe decoding using different combinations of failed codewords is described with reference to FIG. 3.

A determination is made as to whether any of the trial codewords for the $k^{th}$ stripe are decodable, at 234. For example, one or more trial versions of the first stripe codeword 191 may be provided to the ECC engine 136 to attempt a decoding operation at the stripe decoder 156, at 234. A determination is made, at 236, as to whether all stripes of the data structure 110 have been processed (i.e., if k equals the number of stripes (K) in the data structure 110). If any stripes have not been processed, then the loop counter k is incremented, at 238, and processing returns to generating the codeword for the next stripe, at 232. Otherwise, processing returns to 203 to determine whether the codeword n is decodable, at 203.

By first attempting decoding of each of the codewords and next attempting decoding of each stripe, individual sections of the various codewords may be error corrected. For example, correction of errors in a stripe may improve the likelihood of decoding success for one or more of the codewords 160-162. Likewise, successful decoding of one of the codewords 160-162 further increases the probability of successful decoding of one or more of the stripes of the data structure 110. Iteratively alternating between decoding columns (e.g., stripes) and decoding rows (e.g., codewords) of the data structure 110 enables correction of errors in one or more of the columns to increase a likelihood that one or more of the rows will become decodable. Similarly, correction of errors in one or more of the rows increases a likelihood that one or more of the columns will become decodable. Iteratively alternating between decoding columns (e.g., stripes) and decoding rows (e.g., codewords) of the data structure 110 can result in correction of a sufficient number of bits in the $n^{th}$ codeword to enable decoding of the $n^{th}$ codeword and sending of an error corrected version of the requested data to the access device 170 of FIG. 1.

Figure 3:
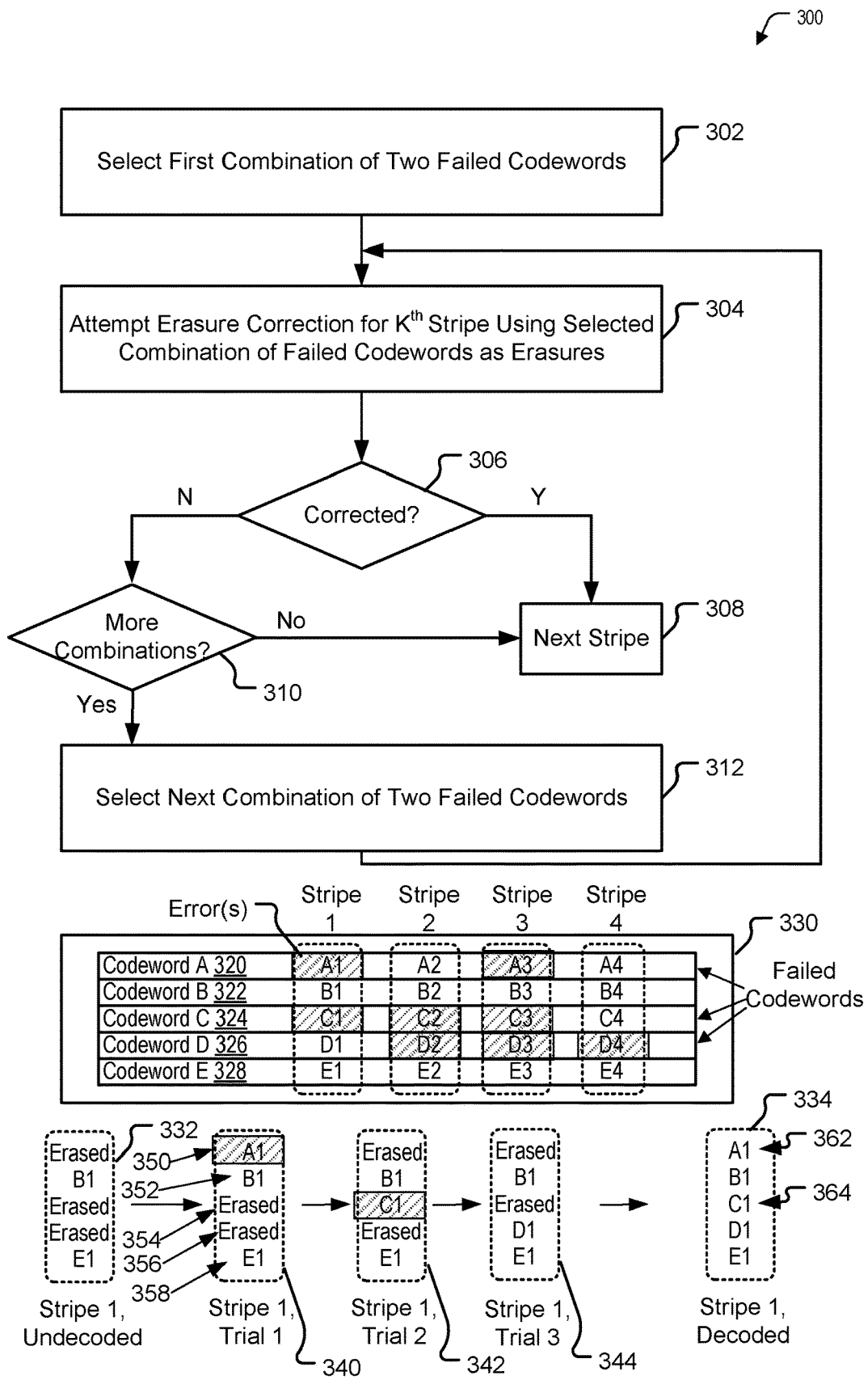
FIG. 3 is a flow diagram of a particular example of a method of encoding data that may be performed by the data storage device of FIG. 1.

Referring to FIG. 3, a particular illustrative example of a method of stripe decoding using different combinations of failed codewords is depicted and generally designated 300. The method 300 may be performed at a data storage device, such as at the data storage device 102 of FIG. 1. One or more operations of the method 200 may be performed or initiated by the controller 130, such as in response to a data write request from the access device 170 of FIG. 1. As an example, the method 300 may be performed during generation of trial codewords and attempting erasure correction of the trial codewords at 232-234 of the method 200 of FIG. 2.

The method 300 includes selecting a first combination of two failed codewords, at 302. An erasure correction for the $k^{th}$ stripe is attempted using the selected combination of failed codewords as erasures, at 304. For example, the stripe generator 190 of FIG. 1 may track the number "Y" of failed codewords of the data structure 110 that are "undecodable" by the ECC decoder 154 (e.g., by having a number of bit errors that exceeds an error correction capability of the ECC decoder 154). The stripe generator 190 may select Z of the Y failed codewords as corresponding to erased data and may designate the remaining (Z-Y) failed codewords as corresponding to valid data. The resulting trial stripe data generated by the stripe generator 190 may be provided to the stripe decoder 156 for decoding.

To illustrate, an example data structure 330 includes five codewords and four stripes. Codeword A includes data errors at portions A1 and A3, rendering codeword A undecodable at the ECC decoder 154. Codeword B is error-free. Codeword C includes data errors at portions C1, C2, and C3. Codeword D includes data error at portions D2, D3 and D4. Codeword E is error-free. Because codewords A, C, and D have more errors than an error correction capacity of the ECC decoder 154, codewords A, C, and D are failed codewords. Thus, the number of failed codewords (Y=3) may exceed the erasure correction capacity of the stripe decoder 156 (Z=2). For example, designating elements of the first stripe 332 that correspond to failed codewords (e.g., elements A1, C1, and D1) as erased data cause the first stripe 332 to be undecodable by the stripe decoder 156.

The stripe generator 190 may generate a first trial version of the first stripe by selecting failed codeword A as contributing valid data (e.g., as if A1 is error-free) and designating codewords C and D as erasures to generate first trial data 340. The first trial data 340 includes an element 350 that is associated with codeword A 320, an element 352 that is associated with codeword B 322, an element 354 that is associated with codeword C 324, an element 356 that is associated with codeword D 326, and an element 358 that is associated with codeword E 328. The first trial data 340 includes at least one element that corresponds to erased data and at least another element that is associated with a failed codeword and that corresponds to valid data of the stripe. To illustrate, elements 354 and 356 correspond to erased data, and element 350 is associated with a failed codeword (codeword A 320) but corresponds to valid (e.g., non-erased, as if A1 is error-free) data of the stripe. The stripe generator 190 may generate a second trial version of the first stripe by selecting failed codeword C as contributing valid data (e.g., as if C1 is error-free) and designating codewords A and D as erasures to generate second trial data 342. The stripe generator 190 may generate a third trial version of the first stripe by selecting failed codeword D as contributing valid data (e.g., as if D1 is error-free) and designating codewords A and C as erasures to generate third trial data 344.

Because the first trial data 340 includes one or more errors in non-erased data (in A1) and the second trial data 342 also includes one or more errors in non-erased data (in C1), decoding of the first trial data 340 and the second trial data 342 fails at the stripe decoder 156. However, because the third trial data 344 has no errors in non-erased data, the third trial data (and therefore the first stripe) is decodable at the stripe decoder 156. The elements of the decoded stripe 1 334 are error-free, including an error-corrected version of the portion A1 362 and an error-corrected version of the portion C2. Codewords A and C may be updated by replacing erroneous portions A1 and C1 with the error-corrected versions 362 and 364, respectively.

The method 300 may include determining whether the trial stripe data was corrected, at 306. If the trial stripe data was corrected, a next stripe is processed, at 308. Otherwise, a determination of whether all distinct combinations of the failed codewords have been tested, at 310. If all distinct combinations of the failed codewords for the $k^{th}$ stripe have been tested (e.g., stripe decoding of each of the trial data 340, 342, and 344 has been attempted), processing advances to the next stripe, at 308. Otherwise, a next combination of two failed codewords is selected, at 312, and a next trial version of the $k^{th}$ stripe is processed at the stripe decoder 156.

By generating trial versions of each of the stripes based on using different combinations of failed codewords, stripes may be decoded even though the number of failed codewords (Y) exceeds the erasure correction capacity (Z). For example, stripe 1 can be decoded by designating failed codeword D as corresponding to valid data (portion D1) and failed codewords A and C as corresponding to erasure data (portions A1 and C1). Stripe 2 can be decoded by designating failed codeword A as corresponding to valid data (portion A2) and failed codewords C and D as corresponding to erasure data (portions C2 and D2). Stripe 3 cannot be decoded, and stripe 4 can be decoded via random error correction because the number of erroneous data portions (a single portion D4) is equal to Z/2. As a result, three of the four stripes can be corrected, leaving erroneous data remaining only in stripe 3. Because each of the modified codewords A, C, and D have a single erroneous portion (after updating data portions of the codewords based on the stripe corrections), each of the modified codewords A, C, and D are correctable at the ECC decoder 154.

Although the above example uses 5 codewords, 4 stripes, Y=3, and Z=2, in other implementations any other number of codewords, number of stripes, and erasure correction capability (Z) may be used. For example, iterative information exchange as described with respect to the examples of FIGS. 1-3 may be performed between Reed-Solomon (RS) RAID decoding and LDPC decoding, and the RS RAID may be configured to recover up to Z failing pages (Z=1, 2, 3, or any other number).

In case Y>Z pages have failed LDPC decoding, a joint iterative decoding process between the LDPC and the RS RAID may be performed. For example, a RS decoding operation may be performed that traverses all the RS code stripes in a data structure. For each RS stripe with less than floor (Z/2) erroneous symbols, the errors are corrected by the RS decoder. If the RS decoding fails, then an additional step may be performed by performing up to $$\binom{Y}{Z} = \frac{Y!}{Z!(Y-Z)!}$$

(where "!" indicates the factorial function) RS decoding attempts. In each such decoding attempt a different set of Z symbols out of the Y failing pages will be marked as erased. If the number of erroneous symbols in the RS stripe is less than or equal to Z, then one of these decoding attempts will succeed.

Once the "horizontal" RS decoding operation has performed the above decoding procedure on all the RS stripes, one or more of the RS stripes may have decoded successfully. In this case, the overall BER observed by the LDPC codes is reduced. Then a next "vertical" decoding operation may be initiated to traverse all the pages (e.g., rows of the data structure 110 or 330) and performing LDPC decoding.

Once the vertical LDPC decoding operation has completed, one or more of the LDPC decodings may have reduced the BER. In this case, a next horizontal RS decoding operation may be performed. This iterative process between the horizontal RS operations and the vertical LDPC operations may continue as long as BER is reduced in each step up to full convergence and decoding of all the data pages.

Figure 4:
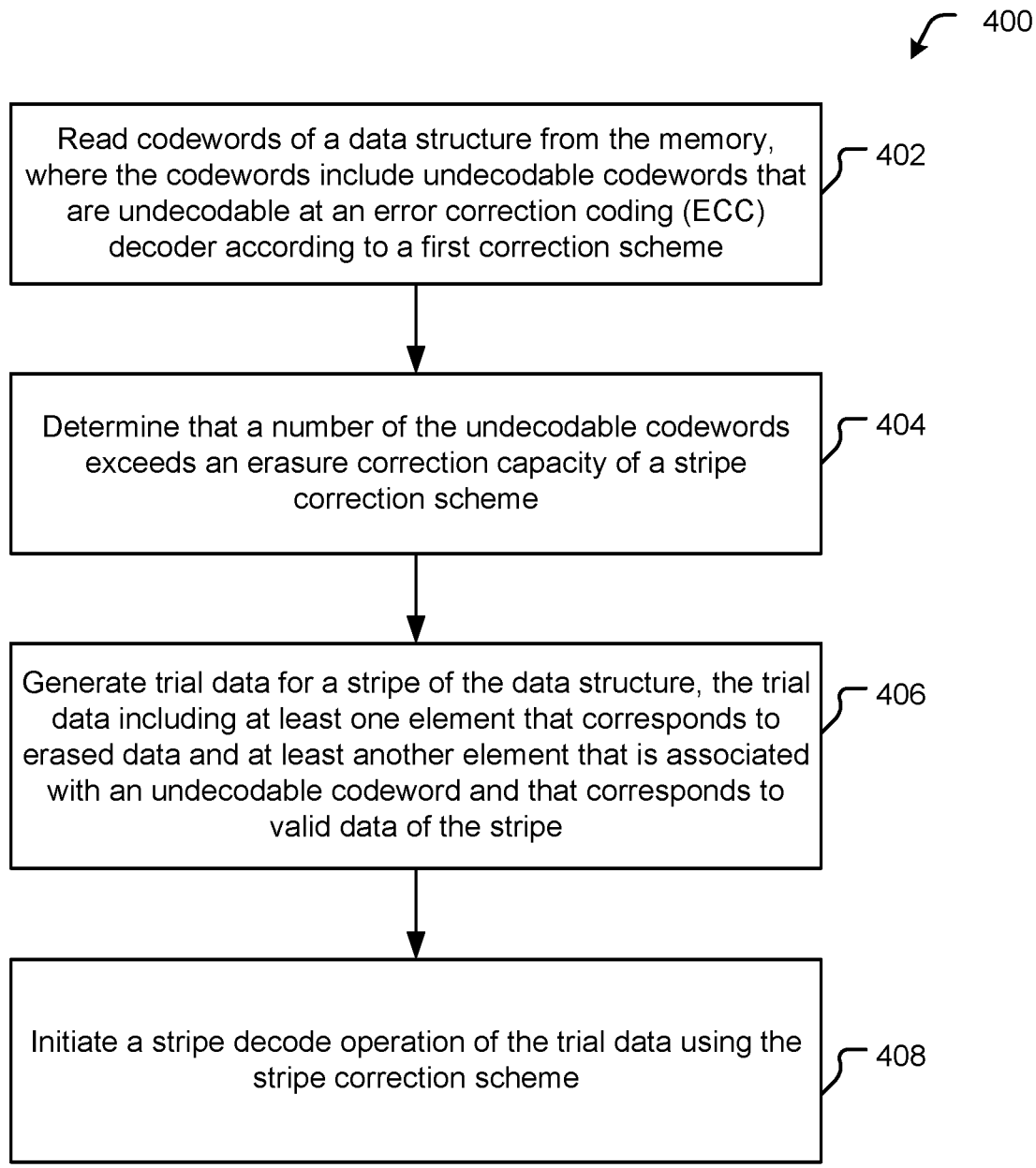
FIG. 4 is a flow diagram of another particular example of a method of decoding data that may be performed by the data storage device of FIG. 1.

Referring to FIG. 4, a particular illustrative example of a method of encoding data is depicted and generally designated 400. The method 400 may be performed at a data storage device, such as at the data storage device 102 of FIG. 1. One or more operations of the method 400 may be performed or initiated by the controller 130, such as in response to a data write request from the access device 170 of FIG. 1.

The method 400 includes reading codewords of a data structure from the memory, at 402. For example, the controller 130 of FIG. 1 may read codewords of the data structure 110 from the memory 104, as described with reference to FIG. 1. To illustrate, the controller 130 may route a representation of one or more of the codewords 160-166 to the ECC engine 136. The codewords 160-166 may include undecodable codewords that are undecodable at the ECC decoder 154 according to the first correction scheme 150, as described with reference to FIG. 1. At least one of the codewords (e.g., the first parity codeword 164, the second parity codeword 166, or both) may include parity data for multiple stripes (e.g., the first stripe 197 and the second stripe 199) of the data structure 110. In a particular aspect, the controller 130 of FIG. 1 may read the codewords in response to receiving a request for data from the access device 170. The data may be encoded in a particular codeword (e.g., the first codeword 160) of the undecodable codewords.

The method 400 also includes determining that a number of the undecodable codewords exceeds an erasure correction capacity of a stripe correction scheme, at 404. For example, the stripe generator 190 of FIG. 1 may determine that a number of the undecodable codewords exceeds an erasure correction capacity of the second correction scheme 152, as described with reference to FIG. 1.

The method 400 further includes generating trial data for a stripe of the data structure, at 406. The trial data includes at least one element that corresponds to erased data and at least another element that is associated with an undecodable codeword and that corresponds to valid data of the stripe. For example, the first trial data 340 of FIG. 3 includes elements 354 and 356 that correspond to erased data and at least another element (element 350) that is associated with a failed codeword (codeword A 320) and corresponds to valid (e.g., non-erased, as if A1 is error-free) data of the stripe. As another example, the stripe generator 190 of FIG. 1 may generate trial data for the first stripe 197 of the data structure 110 such that at least one of the undecodable codewords (e.g., the first codeword 160) corresponds to erased data (e.g., the first portion 171) of the first stripe 197 and at least another of the undecodable codewords (e.g., the $S^{th}$ codeword 162) corresponds to valid data (e.g., the first portion 173) of the first stripe 197, as described with reference to FIG. 1. Generating the trial data may include grouping the first portion 171 and a first portion of one or more other codewords, including the first portion 173 of the $S^{th}$ codeword 162 to form the first stripe codeword 191, as described with reference to FIG. 1. The stripe generator 190 may select a second number of the undecodable codewords to correspond to the erased data and may designate the first portion from the selected codewords as being erased, as described with reference to FIG. 1. The second number may equal the erasure correction capacity of the second correction scheme 152.

The method 400 also includes initiating a stripe decode operation of the trial data using the stripe correction scheme, at 408. For example, the stripe decoder 156 of FIG. 1 may initiate a stripe decode operation of the trial data using the second correction scheme 152, as described with reference to FIG. 1.

The ECC decoder 154 may alternate between codeword processing using the first correction scheme 150 and stripe processing using the second correction scheme 152. Such alternating between codeword processing and stripe processing may continue until the particular codeword (e.g., the first codeword 160) is decoded, as described with reference to FIG. 1. The first correction scheme 150 may include a LDPC scheme, and the second correction scheme 152 may include the Reed-Solomon scheme. The ECC decoder 154 may, for each undecoded stripe (e.g., the first stripe 197) of the data structure 110, test different combinations of the undecodable codewords as erased data until the stripe (e.g., the first stripe 197) is decoded or until all distinct combinations of the undecodable codewords as erased data have been tested.

The ECC decoder 154 may, in response to at least one stripe (e.g., the first stripe 197) being undecodable after decode processing of the stripes (e.g., the first stripe 197 and the second stripe 199) of the codeword (e.g., the first codeword 160), initiate a decode operation of a modified version of a first undecoded codeword (e.g., the first codeword 160) of the undecoded codewords according to the first correction scheme 150. The modified version may include an error-corrected version of a portion (e.g., the first portion 171 or the second portion 181) of the first undecoded codeword (e.g., the first codeword 160), as described with reference to FIG. 1. For example, the decoded stripe 1 334 of FIG. 3 includes an error-corrected version 362 of the first portion (A1) of codeword A 320. A modified version of codeword A 320 may include the error-corrected version 362 of the first portion (A1).

In some cases, one or more codewords (or pages) may be undecodable after application of the ECC decoding and the stripe decoding described with reference to FIGS. 1-4. In order to decode such undecodable codewords, other decoding operations may be performed. Such decoding operations may include performing erasure decoding/correction on a codeword and a modified codeword. The erasure decoding/correction may be performed based at least in part on one or more erased bits of the codeword. To illustrate, one or more erased bits of the codeword may be identified, as further described herein, and the erasure decoding/correction may be performed on the codeword and the modified codeword. The modified codeword may be a modified version of the codeword that has different values for the one or more erased bits. Additionally, or alternatively, the decoding operations may include an iterative decoding process for undecodable codewords that includes replacing one or more bits of an undecodable codeword with one or more bits of a combined codeword (e.g., a combined codeword generated based on a XOR of the other codewords and parity data). Selection of bits to replace in the undecodable codeword may be based on combined reliability information (e.g., a combination of the reliability information corresponding to the other codewords). Systems and methods to perform these additional decoding operations are described with reference to FIGS. 5-9.

Figure 5:
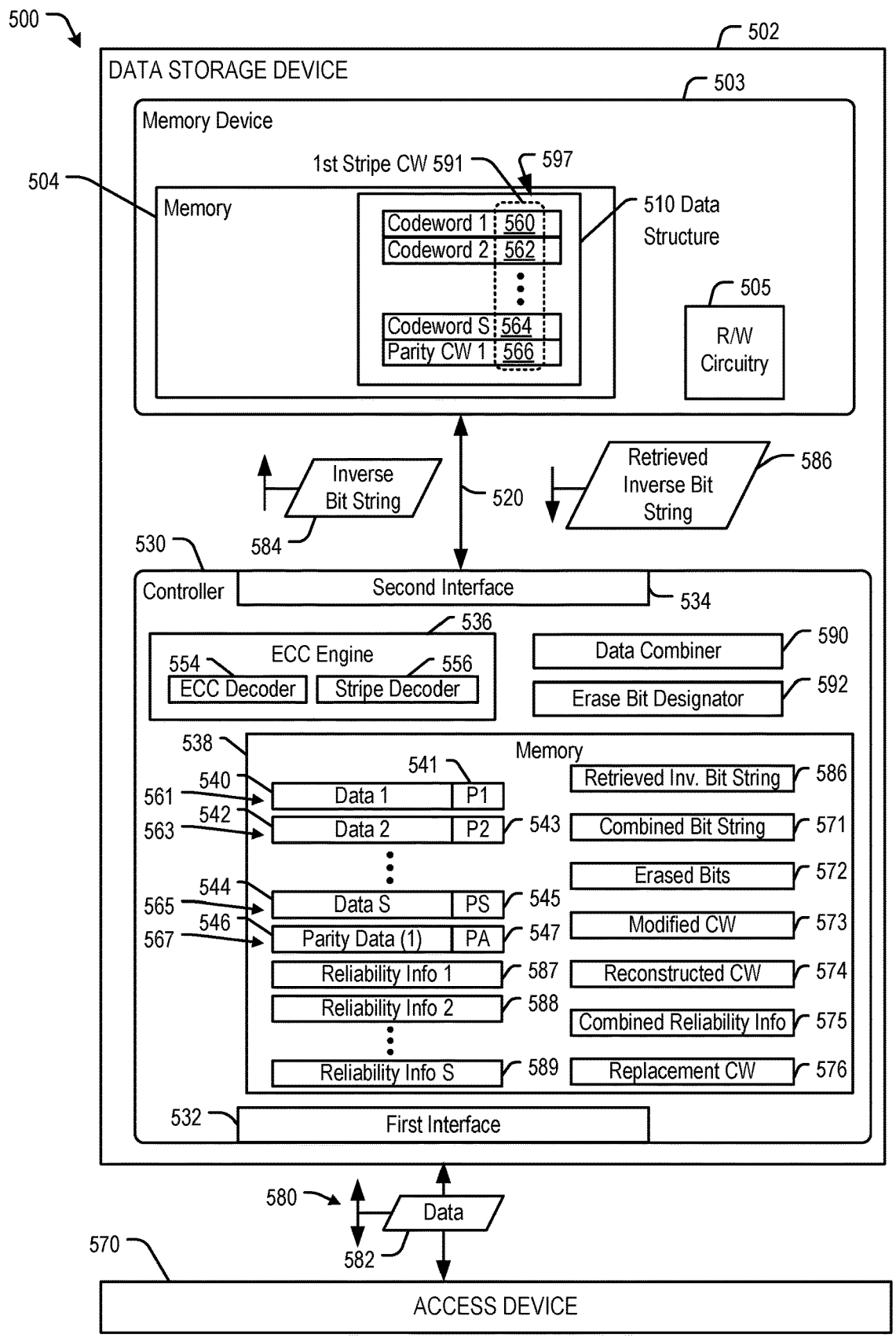
FIG. 5 is a block diagram of an example of a system including a data storage device including an ECC engine configured to decode data using erasure decoding/correction techniques as part of a single decoding operation or an iterative decoding process.

FIG. 5 illustrates a system 500 that includes a data storage device 502 and an access device 570 (e.g., a host device or another device). For example, the data storage device 502 and the access device 570 may include or correspond to the data storage device 102 and the access device 170 of FIG. 1, respectively. As further described herein, the data storage device 502 may be configured to perform decoding operations that may be capable of decoding codewords that are otherwise undecodable using ECC decoding or stripe decoding.

The data storage device 502 includes a memory device 503 coupled to a controller 530. The controller 530 is coupled to the access device 570 via a connection (e.g., a communication path 580), such as a bus or a wireless connection. The data storage device 502 may include a first interface 532 (e.g., an access device or host interface) that enables communication via the communication path 580 between the data storage device 502 and the access device 570. For example, the first interface 532 and the communication path 580 may include or correspond to the first interface 132 and the communication path 180 of FIG. 1, respectively. In some implementations, the data storage device 502 and the access device 570 may be produced, or may operate, in accordance with one or more industry specifications, as described with reference to FIG. 1.

The memory device 503 of the data storage device 502 may include one or more memory dies. The memory device 503 includes a memory 504, such as a non-volatile memory of storage elements included in a memory die of the memory device 503. For example, the memory device 503 and the memory 504 may include or correspond to the memory device 103 and the memory 104 of FIG. 1, respectively. In a particular implementation, the memory 504 includes a storage class memory. A storage class memory may differ from a flash memory, such as a NAND flash memory, in that data can be written to individual addresses (instead of using block writes) and data can be read from the storage class memory, written to the storage class memory, or both, with reduced latency as compared to the flash memory. Additionally or alternatively, data may be written in place (e.g., individual memory cells may be updated) at the storage class memory, such that a write operation may be performed at a particular memory cell without erasing a block of memory cells that includes the particular memory cell prior to performing the write operation. In other implementations, the memory device 503 may be a different type of memory device. The memory device 503 may have a 3D memory configuration (e.g., a monolithic 3D memory configuration or a non-monolithic 3D memory configuration), a 2D memory configuration, or another configuration. Although the data storage device 502 is illustrated as including the memory device 503, in other implementations, the data storage device 502 includes multiple memory devices, and techniques described with respect to pages of the memory 504 may be extended across multiple dies, across multiple packages, across multiple memory devices, or any combination thereof, as described with reference to FIG. 1. The memory device 503 may include support circuitry, such as read/write circuitry 505, to support operation of one or more memory dies of the memory device 503. For example, the read/write circuitry 505 may include or correspond to the read/write circuitry 105 of FIG. 1.

The memory 104 may include one or more storage elements that may be programmable to a state (e.g., a threshold voltage or a resistive state, as non-limiting examples). The storage elements may be grouped, and each group of storage elements of the memory 504 may include one or more word lines. Each word line may include one or more pages, such as one or more physical pages. In some implementations, each page may be configured to store a codeword. A word line may be configured to operate as a SLC word line, as a MLC word line, or as a TLC word line, as illustrative, non-limiting examples.

The memory 504 may be configured to store a data structure 510. The data structure 510 includes multiple codewords (e.g., "S" codewords, where S is an integer greater than one), such as a first codeword 560 ("Codeword 1"), a second codeword 562 ("Codeword 2"), and one or more additional codewords, including an $S^{th}$ codeword 564. Although three codewords are illustrated, in other implementations, S may be any integer greater than 1. The data structure 510 also includes a parity codeword 566 ("Parity CW 1"). Each of the codewords 560-566 may be stored at separate pages of the memory 504, and each of the codewords 560-566 may be decodable independently of the other codewords 560-566. For example, each of the codewords 560-566 may include corresponding parity bits that enable correction of one or more bit errors in the codewords 560-566. In the event that one or more of the codewords 560-564 contain a number of bit errors that exceeds a correction capability of an ECC scheme, the parity codeword 566 may be used to generate error-corrected data corresponding to a stripe of the data structure 510, such as a first stripe codeword 591 corresponding to a first stripe 597. Although one stripe is illustrated in FIG. 5, the data structure 510 may include more than one stripe, as described with reference to FIG. 1. Although operations are described herein as being performed on codewords, in other implementations, the operations may be performed on any independently decodable chunk of memory, such as pages.

To illustrate, the first stripe codeword 591 includes the first codeword 560, the second codeword 562, and the $S^{th}$ codeword 564. The codewords 560-564 may be encoded using a stripe encoding scheme (which may be the same or different than the ECC scheme) to generate the parity codeword 566. In other implementations, first portions of the codewords 560-564 may be encoded to form first parity data that corresponds to first portions of multiple parity codewords in the first stripe 597, second portions of the codewords 560-564 may be encoded to form second parity data that corresponds to second portions of the multiple parity codewords in a second stripe, etc., as described with reference to FIG. 1.

The controller 530 is coupled to the memory device 503 via a bus 520, an interface (e.g., interface circuitry, such as a second interface 534), another structure, or a combination thereof. For example, the bus 520 and the second interface 534 may include or correspond to the bus 120 and the second interface 134 of FIG. 1, respectively.

The controller 530 is configured to receive data and instructions from the access device 570 and to send data to the access device 570, such as via the first interface 532. The controller 530 is configured to send data and commands to the memory 504 and to receive data from the memory 504. For example, the controller 530 is configured to send data and a write command to cause the memory 504 to store data to a specified address of the memory 504. The write command may specify a physical address of a portion of the memory 504 (e.g., a physical address of a word line of the memory 504) that is to store the data. The controller 530 may also be configured to send data and commands to the memory 504 associated with background scanning operations, garbage collection operations, and/or wear leveling operations, etc., as illustrative, non-limiting examples. The controller 530 is configured to send a read command to the memory 504 to access data from a specified address of the memory 504. The read command may specify the physical address of a portion of the memory 504 (e.g., a physical address of a word line of the memory 504).

The controller 530 may include an ECC engine 536, a data combiner 590, an erase bit designator 592, and a memory 538 (e.g., a buffer or other non-volatile memory, such as a DRAM, that is included in or coupled to the controller 530). In some implementations, the memory 538 includes or corresponds to a RAM within the controller 530 or a SDRAM that is coupled to the controller 530, such as a DDR3 SDRAM. In some implementations, the ECC engine 536, the data combiner 590, and the erase bit designator 592 include dedicated circuitry (e.g., dedicated hardware, field-programmable gate arrays (FPGAs), application specific integrated circuits (ASICs), controllers, etc.) configured to perform the operations described herein. Alternatively, one or more operations described with reference to the ECC engine 536, the data combiner 590, and the erase bit designator 592 may be performed by the controller 530.

The ECC engine 536 is configured to receive data to be stored to the memory 504 and to generate a codeword. For example, the ECC engine 536 may include an encoder configured to encode data using an ECC scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine 536 may include one or more decoders configured to decode data read from the memory 504 to detect and correct, up to an error correction capability of the ECC scheme, any bit errors that may be present in the data.

For example, the ECC engine 536 may include a first decoder, such as an ECC decoder 554, to decode codewords (e.g., codewords 560-566) according to a first correction scheme (e.g., an ECC scheme). The ECC engine 536 may include a second decoder, such as a stripe decoder 556, to correct errors or erasures in the stripe codewords of the data structure 510 (e.g., the first stripe codeword 591) according to a second correction scheme (e.g., a stripe decoding scheme). The first correction scheme and the second correction scheme may be a common correction scheme or may be different correction schemes. In a particular implementation, the ECC decoder 554 includes a Bose-Chaudhuri-Hocquenghem (BCH) decoder. Although BCH is provided as a non-limiting example, in other implementations the ECC decoder 554, the stripe decoder 556, or both, may be a different type of decoder (e.g., configured to decode in accordance with a different correction scheme).

The controller 530 is configured to receive a read instruction from the access device 570 and to read and decode one or more codewords from the memory 504 to generate user data (e.g., data 582). For example, the read instruction may indicate an address (or address range) corresponding to one or more of the codewords 560-564, and the controller 530 may read representations of one or more of the codewords 560-564 in response to receiving the read command from the access device 570. The representations of the codewords 560-564 may be stored at the memory 538 and provided to the ECC engine 536 for decoding via the ECC decoder 554 or the stripe decoder 556. If decoding is successful, the data 582 is generated, and the controller 530 is configured to provide the data 582 to the access device 570. If decoding is unsuccessful, the controller 530 may be configured to perform additional decoding operations to decode one or more of the representations of the codewords 560-564.

To illustrate, the data combiner 590 may be configured to combine data representative of two or more bit strings (e.g., codewords, non-codeword bit strings, or a combination thereof) to form data representative of a combined bit string. For example, the data combiner 590 may be configured to perform an exclusive-or (XOR) operation on the two or more bit strings to form the data representative of the combined bit string, as further described herein. In a particular implementation, the two or more bit strings may include data representative of a codeword and data representative of an inverse bit string that is based on the codeword. In another particular implementation, the two or more bit strings may include data representative of one or more undecodable codewords and one or more parity codewords.

The erase bit designator 592 may be configured to designate one or more bits of a representation of a codeword as erased bits. In a particular implementation, the erase bit designator 592 is configured to designate the erased bits based on the data representative of a combined codeword that is generated by the data combiner 590, as further described herein. In other implementations, the erase bit designator 592 is configured to designate the erased bits using other techniques. The ECC engine 536 may be configured to perform one or more erasure decoding operations based on the erased bits and data representative of one or more codewords, as further described herein. The erasure decoding/correction operation(s) may be performed as part of a single decoding operation or an iterative decoding process. The erasure decoding/correction operation(s) may be able to decode codewords that are undecodable by the ECC decoder 554 or the stripe decoder 556 without designation of the erased bits, as further described herein.

During operation, the controller 530 may initiate one or more read operations at the memory 504. For example, the controller 530 may read a representation of the first codeword 560 in response to a read command received at the data storage device 502 from the access device 570. To illustrate, the read command may include an address (e.g., a logical address) or address range, and the controller 530 (or the read/write circuitry 505) may convert the logical address to a physical address that stores the first codeword 560 at the memory 504. The controller 530 may store a first retrieved codeword 561 (e.g., a representation of the first codeword 560 that is read from the memory 504) at the memory 538. The first retrieved codeword 561 may include first data 540 and first parity bits 541.

In a similar manner, the controller 530 may read a representation of the second codeword 562 from the memory 504, and the controller 530 may store a second retrieved codeword 563 (e.g., a representation of the second codeword 562) at the memory 538. The second retrieved codeword 563 may include second data 542 and second parity bits 543. The controller 530 may also read a representation of the $S^{th}$ codeword 564 from the memory 504, and the controller 530 may store an $S^{th}$ retrieved codeword 565 (e.g., a representation of the $S^{th}$ retrieved codeword 565) at the memory 538. The $S^{th}$ retrieved codeword 565 may include $S^{th}$ data 544 and $S^{th}$ parity bits 545. The controller 530 may further read a representation of the parity codeword 566 from the memory 504, and the controller 530 may store a retrieved parity codeword 567 (e.g., a representation of the parity codeword 566) at the memory 538. The retrieved parity codeword 567 may include parity data 546 and parity bits 547.

In some implementations, the representations of the codewords 562-566 are read from the memory 504 in response to an error in decoding the first retrieved codeword 561. For example, the first retrieved codeword 561 may be provided to the ECC decoder 554 for decoding. If the first retrieved codeword 561 includes a number of bit errors that exceeds the error correction capability of the ECC decoder 554 (e.g., the first retrieved codeword 561 represents a failed codeword), the ECC decoder 554 may signal an error. In response to the error from the ECC decoder 554, the controller 530 may receive the retrieved codewords 563-567 from the memory 504, and the stripe decoder 556 may attempt to decode the first retrieved codeword 561 based on the retrieved codewords 563-567, as further described with reference to FIG. 1. For example, the stripe decoder 556 may perform an XOR operation on the rest of the first stripe 597, such as the second retrieved codeword 563, the $S^{th}$ retrieved codeword 565, and the retrieved parity codeword 567, to generate a reconstructed first codeword, which may be provided to the ECC decoder 554 for decoding (or may be further decoded by the stripe decoder 556). However, if a number of failed codewords in retrieved codewords 561-567 exceeds an erasure correction capability of the stripe decoder 556, the stripe decoder 556 may signal an error. In some implementations, the controller 530 may generate trial versions of one or more stripes in order to decode one or more failed codewords, as described with reference to FIGS. 1-4, and if the trial versions do not yield decodable data, the stripe decoder 556 signals the error.

In some implementations, in response to an error from the ECC decoder 554, from the stripe decoder 556, or both, the controller 530 may perform additional operations to decode the retrieved codewords 561-567. Alternatively, the controller 530 may perform the additional operations in parallel with decoding operations at the ECC decoder 554, at the stripe decoder 556, or both.

In a particular implementation, the additional operations are part of a single decoding operation. To illustrate, in response to determining that the first retrieved codeword 561 is undecodable at the ECC decoder 554 and at the stripe decoder 556, the controller 530 may perform an erasure decoding operation. As used herein, an erasure decoding operation may refer to a combination of an erasure correction operation and a decoding operation. In a particular implementation, the stripe decoder 556 may be configured to perform an erasure correction operation that generates a replacement codeword having one or more correct values for one or more erased bits, and the ECC decoder 554 may be configured to perform ECC decoding on the replacement codeword to generate decoded data if the replacement codeword has fewer errors than an error correcting capacity of the ECC decoder.

To identify erased bits for the erasure decoding operation, the controller 530 may generate complementary data, store the complementary data at the memory 504, read a representation of the complementary data from the memory 504, and compare the representation of the complementary data to the first retrieved codeword 561 to determine which bits to designate as erased bits. The controller 530 may also generate a modified codeword based on the first retrieved codeword 561 and the erased bits and perform the erasure decoding operation on the first retrieved codeword 561 and the modified codeword.

To illustrate, the controller 530 may be configured to generate an inverse bit string 584 based on the first retrieved codeword 561. For example, a value of each bit of the inverse bit string 584 may be inverted with respect to a value of a corresponding bit of the first retrieved codeword 561. As used herein, an inverted or inverse value refers to a complement of the value. For example, if a codeword is a binary codeword having the binary value 00110110, the inverse bit string has the binary value 11001001 (e.g., each bit of the inverse bit string is the inverse/complement of the corresponding bit of the codeword).

The controller 530 may write the inverse bit string 584 to the physical location of the memory 504 (e.g., the location storing the first codeword 560). To illustrate, the memory 504 may include or correspond to a storage class memory, and the controller 530 may issue a write-in-place command (or other write command) that includes the inverse bit string 584 and the physical address. In response to the write-in-place command (or other write command), the memory device 503 (e.g., the read/write circuitry 505) may write the inverse bit string 584 to the physical location. Because the inverse bit string 584 is written to the same physical location that stores the first codeword 560, the inverse bit string 584 may overwrite the first codeword 560.

After overwriting the first codeword 560 with the inverse bit string 584, the controller 530 may read a representation of the inverse bit string 584 (e.g., a retrieved inverse bit string 586) from the memory 504. The retrieved inverse bit string 586 may match the inverse bit string 584 except for values of one or more bits, such as bits that are stored at "stuck" or otherwise erroneous storage elements of the memory 504. For example, due to manufacturing defects, defects that occur over time, or other errors at the memory 504, one or more storage elements may have a state (e.g., a threshold voltage) that is not modifiable, and thus values of one or more bits of the retrieved inverse bit string 586 may be different than values of one or more corresponding bits of the inverse bit string 584. To illustrate, a stuck storage element may always be read as having the same bit value, independent of the bit value stored to the stuck storage element. Such bits may be designated as erased bits (or "erasure" bits) and may be used to perform erasure decoding (e.g., erasure correction and decoding). In some implementations, after receiving the retrieved inverse bit string 586, the controller 530 may issue another write-in-place command (or other write command) to overwrite the inverse bit string 584 at the physical location of the memory 504 with the first retrieved codeword 561 (or a modified version of the first retrieved codeword 561 that is decodable), such that data stored at the memory 504 after performance of the read command from the access device 570 corresponds to the same data that is stored at the memory 504 before performance of the read command.

The controller 530 (e.g., the erase bit designator 592) may designate one or more bits of the first retrieved codeword 561 (e.g., the representation of the first codeword 560) as one or more erased bits 572 based on the first retrieved codeword 561 and the retrieved inverse bit string 586 (e.g., the representation of the inverse bit string 584). In order to identify which bits are the erased bits 572, the controller 530 (e.g., the data combiner 590) may combine the retrieved inverse bit string 586 and the first retrieved codeword 561 to generate a combined bit string 571. For example, the data combiner 590 may be configured to perform a XOR operation on the first retrieved codeword 561 and the retrieved inverse bit string 586 to generate the combined bit string 571. The erase bit designator 592 may designate the erased bits 572 based on the combined bit string 571. The erased bits 572 may correspond to one or more bits that have the same value in the first retrieved codeword 561 and the retrieved inverse bit string 586 (e.g., one or more bits having a zero value in the combined bit string 571). Because the inverse bit string 584 and the first retrieved codeword 561 have no bit values in common, any bit values in common between the retrieved inverse bit string 586 and the first retrieved codeword 561 are likely due to stuck storage elements at the memory 504, and thus the corresponding bits can be designated as the erased bits 572. A particular example of designating the erased bits 572 is further described with reference to FIG. 6.

After designating the erased bits 572, the controller 530 may generate a modified codeword 573 for use in decoding, as further described herein. The modified codeword 573 may be generated based on the first retrieved codeword 561 and the erased bits 572. To illustrate, at least one of the erased bits 572 in the first retrieved codeword 561 has a different value than a corresponding bit in the modified codeword 573. For example, the controller 530 may generate the modified codeword 573 by inverting (e.g., complementing) a value of at least one of the erased bits 572 in the first retrieved codeword 561. In a particular implementation, the controller 530 is configured to generate the modified codeword 573 by inverting a corresponding value of each of the erased bits 572 of the first retrieved codeword 561, as illustrated with reference to FIG. 6.

The controller 530 may perform erasure decoding on the first retrieved codeword 561 and the modified codeword 573. For example, the ECC decoder 554, the stripe decoder 556, or both, may be configured to perform a first decoding operation based on the erased bits 572 to decode the first retrieved codeword 561 and to perform a second decoding operation based on the erased bits 572 to decode the modified codeword 573. Either the first retrieved codeword 561 or the modified codeword 573 may be successfully decoded by the erasure decoding operation (e.g., the first decoding operation and the second decoding operation) to generate user data, such as the data 582. In a particular implementation, the first erasure decoding operation may be performed in parallel/concurrently with the second erasure decoding operation. Because the first retrieved codeword 561 and the modified codeword 573 differ only in the values of the erased bits 572, either the first retrieved codeword 561 or the modified codeword 573 is likely to have fewer errors than the other, and thus either the first retrieved codeword 561 or the modified codeword 573 may be decodable using the erasure decoding operation. In a particular implementation, the ECC decoder 554 includes or corresponds to a BCH decoder, and the BCH decoder is configured to correct t random errors and 2t erasures (e.g., erased bits), or any combination of random errors e and erasures E such that $2e+E \leq 2t$. If the number of random errors and erasures satisfy $2e+E \leq 2t$, then either the first retrieved codeword 561 or the modified codeword 573 is decodable by the ECC engine 536 by performing the erasure decoding operations. After decoding the first retrieved codeword 561 or the modified codeword 573 to generate the data 582, the controller 530 may provide the data 582 to the access device 570 in response to the read command.

In another particular implementation, the additional operations are part of an iterative process to decode at least one undecodable (e.g., failed) codeword of a plurality of codewords read from the memory 504. To illustrate, in response to determining that one or more of the retrieved codewords 561-567 (e.g., representations of the codewords 560-566) is undecodable by the ECC decoder 554, by the stripe decoder 556, or both, the controller 530 may perform an iterative process to decode the one or more of the retrieved codewords 561-567 that represent undecodable (e.g., failed) codewords.

At initiation of the iterative process, the controller 530 may read a plurality of codewords including the codewords 560-566 from the memory 504 and may store the retrieved codewords 561-567 at the memory 538. In some implementations, the retrieved codewords 561-567 may already have been received and stored as part of a decoding operation performed by the stripe decoder 556. The controller 530 may also generate reliability information corresponding to each of the retrieved codewords 561-567. For example, the controller 530 may generate first reliability information 587 associated with the first retrieved codeword 561, second reliability information 588 associated with the second retrieved codeword 563, and $S^{th}$ reliability information 589 associated with the $S^{th}$ retrieved codeword 565. In some implementations, the controller 530 also generates reliability information associated with the retrieved parity codeword 567.

The reliability information 587-589 may indicate which bits of the corresponding retrieved codewords 561-567 are likely to be correct (or incorrect). In at least one implementation, the read/write circuitry 505 is configured to sense one or more codewords of the memory 104 using a "soft" read technique to generate the reliability information 587-589. The soft read technique may use multiple sense operations for each storage element of a target codeword (or other portion of the memory 504) to determine the reliability of the target codeword. To illustrate, if a storage element associated with one of the codewords 560-566 stores a threshold voltage that is approximately centered within a target threshold voltage distribution, the reliability information 587-589 may indicate that a bit value associated with the storage element is likely correct. If the storage element stores a threshold voltage that is outside a target threshold distribution (e.g., "between" two target threshold distributions), the reliability information 587-589 may indicate that a bit value associated with the storage element is uncertain or is likely incorrect.

Alternatively or in addition to using a soft bit technique, the reliability information 587-589 may be determined based on threshold voltages of neighboring storage elements. For example, a storage element having a relatively low threshold voltage may experience a threshold shift due to a neighboring storage element being programmed to a relatively high threshold voltage. The controller 530 may cause one or more sets of storage elements (e.g., pages) neighboring the storage elements that store the codeword to be read and may use the resulting data to generate at least a portion of the reliability information 587-589. In some implementations, bit(s) of the reliability information 587-589 may have a first value (e.g., a "0" value) indicating that corresponding bits of the corresponding data (e.g., the representation of the corresponding codeword) are considered "unreliable" or a second value (e.g., a "1" value) indicating that corresponding bits of the corresponding data are considered "reliable." In other implementations, the reliability information 587-589 may have other values.

In some implementations, after generating the reliability information 587-589, the controller 530 performs the above-described erasure decoding operations (including the writing of an inverse bit string) on each of the retrieved codewords 561-567 that are undecodable, and any codewords that still remain undecodable are indicated as failed codewords for processing during the iterative process. The iterative process may be performed until a target codeword of the failed codewords is decodable, or until an error condition occurs.

During each iteration of the iterative process, the controller 530 attempts to correct each of the failed codewords. Correcting a failed codeword may include selectively replacing, based at least in part on reliability information associated with other retrieved codewords stored at the memory 538, one or more bits of the failed codeword with a reconstructed codeword to generate a replacement codeword. Correcting the failed codeword also includes performing a particular decoding operation on the replacement codeword. If the particular decoding operation is successful, the replacement codeword is used to replace the corresponding retrieved codeword stored at the memory 538, and the next failed codeword is processed. If the particular decoding operation is unsuccessful, the corresponding retrieved codeword stored at the memory 538 is not modified/overwritten, and the next failed codeword is processed. The iterative process continues until the target codeword is decodable or until the process performs an iteration during which none of the retrieved codewords stored at the memory 538 are modified, which triggers an error condition.

To illustrate, during a first iteration, the controller 530 may identify the first retrieved codeword 561 and the $S^{th}$ retrieved codeword 565 as failed (e.g., undecodable) codewords. Based on the identifications, the controller 530 may attempt to correct the first retrieved codeword 561 during the first iteration. To illustrate, the controller 530 (e.g., the data combiner 590) may generate a reconstructed codeword 574 based on the retrieved codewords 563-565 (e.g., the plurality of retrieved codewords other than the first retrieved codeword 561) and the retrieved parity codeword 567. For example, the controller 530 (e.g., the data combiner 590) may perform a XOR operation with respect to each retrieved codeword associated with the first stripe 597 to generate the reconstructed codeword 574. The reconstructed codeword 574 may also be referred to as a "XOR codeword" or a "XORed codeword." In a particular implementation in which S=3, the first stripe 197 is associated with the first retrieved codeword 561, the second retrieved codeword 563, the $S^{th}$ retrieved codeword 565, and the retrieved parity codeword 567, and the XOR operation is performed with respect to the second retrieved codeword 563, the $S^{th}$ retrieved codeword 565, and the retrieved parity codeword 567. In other implementations in which S>3, the first stripe 597 is associated with additional codewords, and the XOR operation is performed with respect to the additional codewords.

After generating the reconstructed codeword 574, the controller 530 may generate replacement codeword 576 based on at least in part on reliability information associated with the reconstructed codeword 574. The reliability information may be based on the reliability information associated with the retrieved codewords used to generate the reconstructed codeword 574. For example, the controller 530 (e.g., the data combiner 590) may generate combined reliability information 575 based on the second reliability information 588 and the St reliability information 589. In a particular implementation in which reliable bits are associated with a "1" value and unreliable bits are associated with a "0" value, the controller 530 (e.g., the data combiner 590) is configured to perform an AND operation with respect to the second reliability information 588 and the St reliability information 589 (e.g., the reliability information associated with all the failed codewords) to generate the combined reliability information 575. In another particular implementation in which reliable bits are associated with a "0" value and unreliable bits are associated with a "1" value, the controller 530 is configured to perform an OR operation with respect to the reliability information associated with the failed codewords to generate the combined reliability information 575.

The controller 530 may generate the replacement codeword 576 based on the first retrieved codeword 561, the first reliability information 587 corresponding to the first retrieved codeword 561, the reconstructed codeword 574, and the combined reliability information 575 corresponding to the reconstructed codeword 574. For example, the controller 530 may selectively replace one or more bits of the first retrieved codeword 561 with one or more bits of the reconstructed codeword 574 based at least in part on the combined reliability information 575, as further described with reference to FIG. 7. To illustrate, the controller 530 may replace one or more unreliable bits of the first retrieved codeword 561 with one or more reliable, non-erased bits of the reconstructed codeword 574 to generate the replacement codeword 576.

After generating the replacement codeword 576, the controller 530 may provide the replacement codeword 576 and a designation of erased bits of the replacement codeword 576 to the ECC engine 536 for performance of an erasure decoding operation. In a particular implementation, erased bits for each of the retrieved codewords 561-567 stored at the memory 538 are determined during a previous erasure decoding operation (e.g., by the erase bit designator 592) performed for each of the retrieved codewords 561-567 at initiation of the iterative process, as described above. In other implementations, erased bits for each of the retrieved codewords 561-567 may be determined using other methods. The erased bits associated with the second retrieved codeword 563, the $S^{th}$ retrieved codeword 565, and the retrieved parity codeword 567 may be combined (e.g., via an AND operation if erased bits are associated with a "0" value or via an OR operation if erased bits are associated with a "1" value) to generate erased bits associated with the reconstructed codeword 574. Additionally, the erased bits associated with the replacement codeword 576 may be identified based on the erased bits 572 (e.g., erased bits associated with the first retrieved codeword 561) after designating one or more bits of the erased bits 572 as being data bits (e.g., not erased bits), the one or more bits of the erased bits 572 corresponding to the one or more bits of the first retrieved codeword 561 that are replaced to generate the reconstructed codeword 574.

If the erasure decoding operation is successful, the controller 530 may overwrite the first retrieved codeword 561 with the replacement codeword 576 at the memory 538. In some implementations, counters, an indication buffer, or both may be updated, as further described with reference to FIG. 7. If the erasure decoding operation fails (e.g., is unsuccessful), the first retrieved codeword 561 is not overwritten with the replacement codeword 576, and the replacement codeword 576 may be discarded.

After performing a successful erasure decoding operation with respect to the replacement codeword 576, the controller 530 determines whether the target codeword is decodable. For example, if the target codeword is the first codeword 560, successful decoding of the replacement codeword 576 (which may be stored in the memory 538 instead of the first retrieved codeword 561) may terminate the iterative decoding process. As another example, if the target codeword is not the first codeword 560, the stripe decoder 556 may be able to decode the target codeword based on the decoded replacement codeword 576, the second retrieved codeword 563, the $S^{th}$ retrieved codeword 565, and the retrieved parity codeword 567. If the target codeword has become decodable, the iterative decoding process stops, and the target codeword is decoded to generate at least a portion of the data 582. If the target codeword remains undecodable, the first iteration continues and the next failed codeword (e.g., the $S^{th}$ retrieved codeword 565) is processed as described above with reference to the first retrieved codeword 561. The first iteration continues until the target codeword is decodable, or until each failed codeword has been processed. If at least one failed codeword has been modified at the memory 538 (e.g., by having one or more bits selectively replaced), the iterative process continues to a next iteration, and each failed codeword, whether modified or original, is processed as described above. If no failed codeword is modified during the first iteration (or any subsequent iteration), the controller 530 generates an error condition and terminates the iterative process.

Thus, because the data storage device 502 performs the single operation erasure decoding operations, the iterative decoding process, or both, the data storage device 502 may be able to correct retrieved codewords having a number of errors that exceeds an error correction capability of the ECC decoder 554 (or the stripe decoder 556). Because the operations are performed based on retrieved codewords that are already stored at the memory 538 by operations of the stripe decoder 556, the controller 530 may achieve an improved error correction capability without a significant amount of additional hardware or without significantly increasing power consumption, and without significantly increasing the complexity of the data storage device 502. Thus, the data storage device 502 may provide improved error correction capabilities than other data storage devices without significantly increasing cost or power consumption of the data storage device 502. In some implementations, the data storage device 502 may enable use of a low-cost and low-complexity ECC decoder, such as a BCH decoder, in conjunction with a storage class memory, and the data storage device 502 may be able to support an error correcting capability that is greater than the error correcting capability of the BCH decoder.

Figure 6:
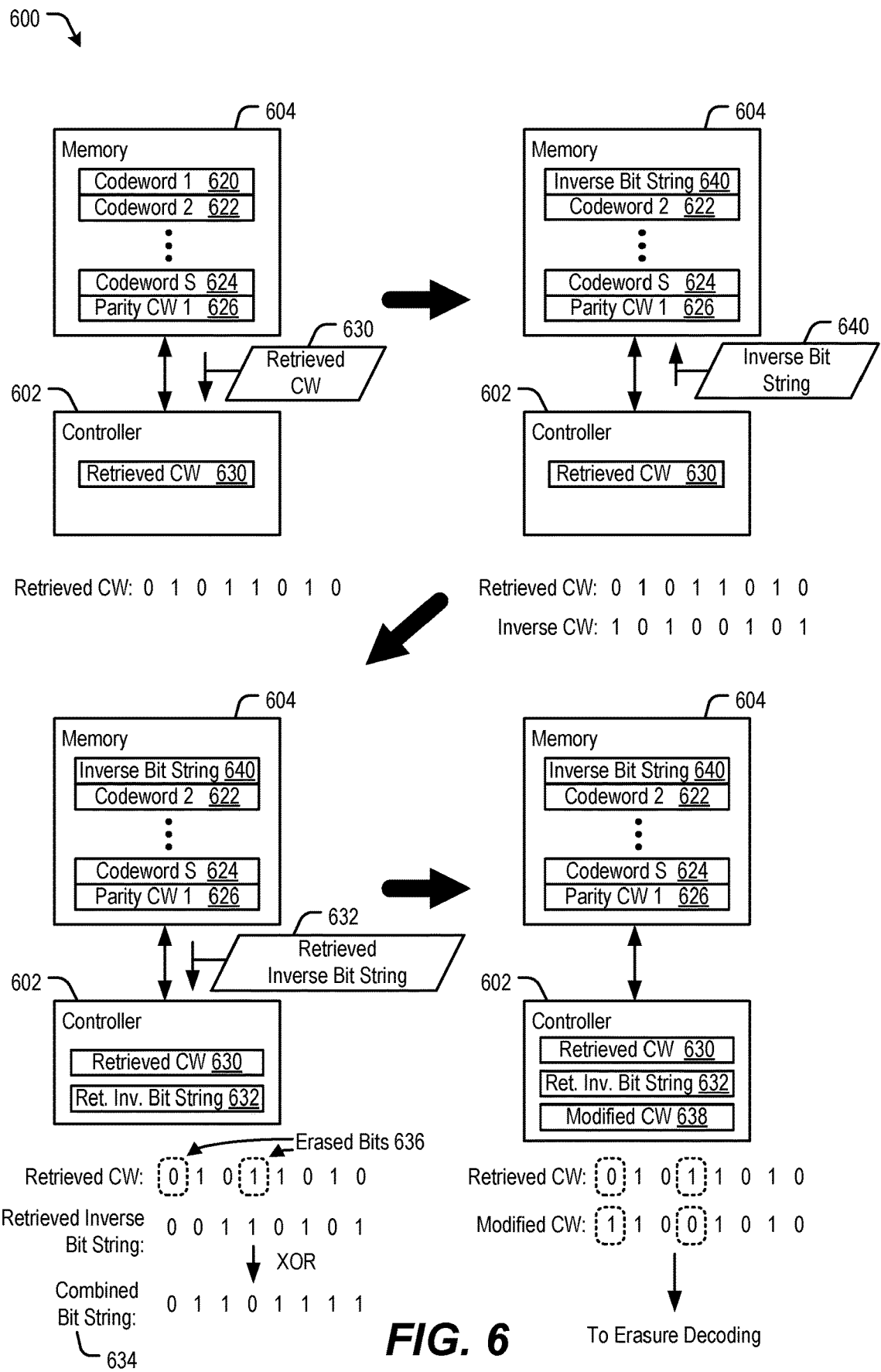
FIG. 6 is a diagram illustrating an example of data stored at a memory and a controller during performance of an erasure decoding/correction operation.

Referring to FIG. 6, a diagram 600 illustrates data stored at a memory and a controller during performance of an erasure decoding operation. In a particular implementation, the erasure decoding operation includes or corresponds to the single erasure decoding operation described with reference to FIG. 5. FIG. 6 illustrates a controller 602 and a memory 604. The memory 604 may include or correspond to a storage class memory, as described with reference to FIG. 5. In a particular implementation, the controller 602 includes or corresponds to the controller 530 of FIG. 5, and the memory 604 includes or corresponds to the memory 504 of FIG. 5. In other implementations, the controller 602 and the memory 604 are included in a device other than the data storage device 502 of FIG. 5.

Beginning in the upper left of FIG. 6, the memory 604 is configured to store a plurality of codewords and parity data associated with the plurality of codewords. For example, the memory 604 may store a first codeword 620 ("Codeword 1"), a second codeword 622 ("Codeword 2"), an St codeword 624 ("Codeword S"), and a parity codeword 626 ("Parity CW 1"). Although three codewords are illustrated (e.g., S=3), in other implementations, S has a positive integer value other than three.

The controller 602 is configured to read one or more codewords from the memory 604. For example, the controller 602 receives, from the memory 604, a retrieved codeword 630 that includes or corresponds to a representation of the first codeword 620 stored at a particular physical location (e.g., address) of the memory 604. The retrieved codeword 630 may be stored at the controller 602, such as at a buffer or other volatile memory (e.g., a RAM, a DRAM, a SDRAM, etc.). In a particular implementation illustrated in FIG. 6, the retrieved codeword 630 represents an 8-bit binary codeword having the binary value "01011010". In other implementations, retrieved codeword 630 and the first codeword 620 may be fewer than 8 bits or more than 8 bits (e.g., thousands of bits), the retrieved codeword 630 and the first codeword 620 may include non-binary values, the retrieved codeword 630 may have a different value, or a combination thereof.

Moving to the upper right of FIG. 6, the controller 602 generates an inverse bit string 640 based on the retrieved codeword 630. In a particular implementation, the controller 602 inverts (e.g., complements) the value of each bit of the retrieved codeword 630 to generate the inverse bit string 640. For example, as illustrated in FIG. 6, the inverse bit string 640 represents an 8-bit binary bit string having the binary value "10100101".

The controller 602 issues a write command that indicates the inverse bit string 640 and the particular physical location. In a particular implementation, the write command includes or corresponds to a write-in-place command. Responsive to receiving the write command, the memory 604 writes the inverse bit string 640 to the particular physical location of the memory 604. As illustrated in FIG. 6, writing the inverse bit string 640 overwrites (e.g., replaces) the first codeword 620 with the inverse bit string 640 at the particular physical location of the memory 604.

Continuing to the lower left of FIG. 6, after issuing the write command, the controller 602 issues a read command that indicates the particular physical location of the memory 604. In response to issuing the read command, the controller 602 receives retrieved inverse bit string 632 from the memory 604. The retrieved inverse bit string 632 is stored at the controller 602 (e.g., at the buffer or volatile memory). The retrieved inverse bit string 632 includes or corresponds to a representation of the inverse bit string 640 that is read from the memory 604. Value(s) of one or more bits of the retrieved inverse bit string 632 may differ from value(s) of one or more bits of the inverse bit string 640. For example, due to errors or defects at storage cells of the memory 604, one or more bits may be stuck such that value(s) stored by the one or more bits may be different than value(s) programmed to the one or more bits, and thus one or more bits of the inverse bit string 640 may fail to be properly programmed during performance of the write operation.

To determine which bits of the retrieved codeword 630 are designated as erased bits, the controller 602 combines the retrieved codeword 630 and the retrieved inverse bit string 632 to generate a combined bit string 634. In a particular implementation illustrated in FIG. 6, the controller 602 performs a XOR operation with respect to the retrieved codeword 630 and the retrieved inverse bit string 632 to generate the combined bit string 634. Bits having a first value (e.g., a "0" value) in the combined bit string 634 indicate bits that have the same value in the retrieved codeword 630 and the retrieved inverse bit string 632, and bits having a second value (e.g., a "1" value) in the combined bit string 634 indicate bits that have different values in the retrieved codeword 630 and the retrieved inverse bit string 632. The controller 602 may determine the bits of the combined bit string 634 that have the first value, and those bits are designated as erased bits 636. For example, in FIG. 6, the first bit and the fourth bit of the combined bit string 634 have the first value (e.g., the "0" value), and thus the first bit and the fourth bit of the retrieved codeword 630 are designated as the erased bits 636.

Continuing to the lower right of FIG. 6, the controller 602 may generate a modified codeword 638 ("Modified CW") based on the retrieved codeword 630. For example, the controller 602 may modify value(s) of one or more of the erased bits 636 of the retrieved codeword 630 to generate the modified codeword 638. In a particular implementation, the controller 602 modifies (e.g., inverts/complements) the value of each of the erased bits 636 in the retrieved codeword 630 to generate the modified codeword 638. For example, the values of the erased bits 636 in the retrieved codeword 630 and the values of the corresponding bits in the modified codeword 638 are different, and the values of the other bits in the retrieved codeword 630 and the values of the other corresponding bits in the modified codeword 638 are the same. As an example, FIG. 6 illustrates that, if the retrieved codeword 630 has the binary value "01011010" and the first bit and the fourth bit are designated as the erased bits 636, the modified codeword 638 has the binary value "11001010." In the example, the values of the first bit and the fourth bit of the retrieved codeword 630 (e.g., "0" and "1", respectively) are different than the values of the first bit and the fourth bit of the modified codeword 638 (e.g., "1" and "0", respectively), and the values of the remaining bits (e.g., the second bit, the third bit, and the fourth-seventh bit) of the retrieved codeword 630 are the same as the values of the remaining bits (e.g., the second bit, the third bit, and the fourth-seventh bit) of the modified codeword 638.

After generating the modified codeword 638, an erasure decoding operation may be performed on the retrieved codeword 630 and on the modified codeword 638. For example, the erasure decoding operation may include a first decoding operation performed on the retrieved codeword 630 and a second decoding operation performed on the modified codeword 638. The first decoding operation and the second decoding operation may be performed concurrently. Alternatively, the first decoding operation and the second decoding operation may be performed serially. For example, the first decoding operation may be initiated while the controller 603 is generating the modified codeword 638. One of the two decoding operations may be more likely to succeed, e.g., to be decodable to generate data (e.g., user data) that may be provided to an access device, as described with reference to FIG. 5. In some implementations, after determining which of the retrieved codeword 630 and the modified codeword 638 is decodable, the controller 602 may issue a write command with the decodable data (either the retrieved codeword 630 or the modified codeword 638) to the memory 604 to overwrite the inverse bit string 640 at the particular physical location of the memory 604, such that data corresponding to the first codeword 620 is rewritten to the particular physical location.

Thus, the operations described with reference to FIG. 6 enable a controller to determine one or more erased bits of a codeword by reading a representation of the codeword from a particular physical location of a memory, writing an inverse bit string to the particular physical location, reading a representation of the inverse bit string from the memory, and comparing the representation of the codeword and the representation of the inverse bit string. In this manner, erased bits may be determined using as few as two additional commands to a memory (e.g., a write command to write the inverse bit string and a read command to read the representation of the inverse bit string). The erased bits may be used to perform an erasure decoding operation on the codeword and a modified codeword. One of the two erasure codewords may be more likely to be successfully decoded (e.g., to generate decoded data) by the erasure decoding operation than a representation of a codeword used in a conventional ECC decoding operation or a stripe decoding operation.

Figure 7:
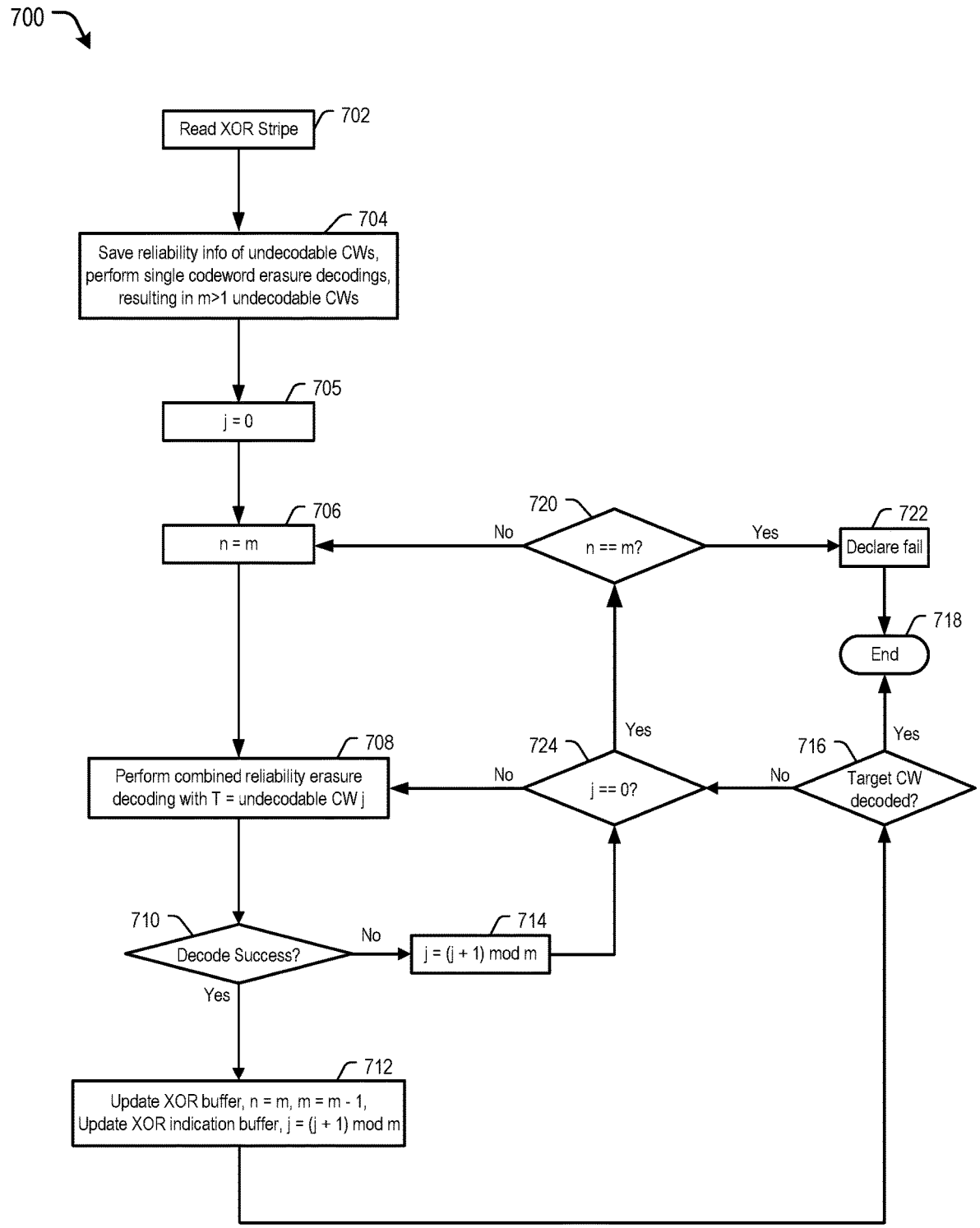
FIG. 7 is a flow diagram of a particular example of a method of decoding data that may be performed by the data storage device of FIG. 5.

Referring to FIG. 7, a particular illustrative example of a method of iteratively decoding failed codewords is depicted and generally designated 700. The method 700 may be performed at a data storage device, such as at the data storage device 502 of FIG. 5. One or more operations of the method 700 may be performed or initiated by the controller 530, such as in response to a read request from the access device 570 of FIG. 5. In other implementations, the operations of the method 700 may be performed by a device other than the data storage device 502 of FIG. 5.

The method 700 includes reading a XOR stripe, at 702. For example, the "XOR stripe" may include or correspond to the first stripe 597 of FIG. 5. Reading the XOR stripe may include reading, by a controller, representations of a plurality of codewords (or portions thereof) from a memory. The plurality of codewords form a XOR codeword, as described with reference to FIGS. 1 and 5. The representations of the plurality of codewords (e.g., a plurality of retrieved codewords) may be stored in a buffer or other volatile memory, such as a RAM, that is internal to (or accessible to) the controller. In a particular implementation, the buffer includes or corresponds to the memory 538 of FIG. 5. Although operations of the method 700 are described as being performed on codewords, in other implementations, the operations may be performed on other size portions of data stored at the memory, such as pages (or portions thereof).

The method 700 includes saving reliability information for undecodable codewords of the plurality of retrieved codewords and performing single codeword erasure decoding operations on each of the undecodable codewords, at 704. At least two of the single codeword erasure decoding operations may fail, resulting in a total of m undecodable codewords, where m is any integer greater than 1. To illustrate, the controller may initiate performance of one or more soft read operations to generate reliability information (e.g., soft bits) for each undecodable codeword. In other implementations, the reliability information may be generated in other ways, such as by reading neighboring word lines. Although described as generating reliability information for the undecodable codewords, reliability information for the other codewords (e.g., decodable codewords) of the XOR stripe may also be generated. Additionally, for each undecodable codeword, an inverse bit string may be generated and used to overwrite the corresponding codeword at the memory, a representation of the inverse bit string (e.g., a retrieved inverse bit string) may be read from the memory, the undecodable codeword and the retrieved inverse bit string may be compared to identify erased bits, modified codewords may be generated based on the undecodable codewords and the erased bits, and erasure decoding operations may be performed to attempt to decode the undecodable codewords and the modified codewords, as described with reference to FIGS. 5 and 6. In some implementations, during such erasure decoding operations, the locations of erased bits for each undecodable codeword may be determined and stored, such as at the buffer.

The method 700 includes initializing a value of a first parameter (j), at 705, and initializing a value of a second parameter (n), at 706. For example, a value of the first parameter j may be initialized to 0, and a value of the second parameter n may be initialized to m. The parameters may be used to determine when to terminate the method 700, as further described herein.

The method 700 includes performing combined reliability erasure decoding on the jth undecodable codeword, at 708. The combined reliability erasure decoding may also be referred to as combined soft bit erasure decoding (e.g., the reliability information may include or correspond to soft bits). Performing the combined reliability erasure decoding may include generating multiple codewords. For example, the controller may generate a reconstructed (e.g., combined) codeword X by performing a XOR operation on each decoded codeword and each remaining undecodable codeword of the plurality of undecodable codewords, other than the jth undecodable codeword, stored in the buffer. Additionally, the controller may generate combined reliability information by performing an AND operation (or an OR operation, depending on whether reliable bits are associated with a "1" value or a "0" value) on the reliability information associated with each undecodable retrieved codeword that is used to generate the reconstructed codeword.

To perform the combined reliability erasure decoding, the controller may further generate a reliability parameter A based on a target codeword T (e.g., the jth undecodable codeword), the reconstructed codeword X (also referred to as a XOR codeword or a XORed codeword), the reliability information associated with the target codeword T, and the combined reliability information. For example, the reliability parameter A may be generated according to Equation 1 as follows:

$$A = (\sim X_e) \text{ AND } [T_e \text{ OR } (\sim T_e) \text{ AND } T_S \text{ AND } (\sim X_S)] \quad \text{(Eq. 1)}$$

where $\sim X_e$ indicates non-erased bits of the reconstructed codeword X, $T_e$ indicates erased bits of the target codeword T, $\sim T_e$ indicates non-erased bits of the target codeword T, $T_s$ indicates bits of the target codeword T that are associated with a low reliability value (e.g., bits of the target codeword T associated with bits of the reliability information having a "0" value), $\sim X_s$ indicates bits of the reconstructed codeword X that are associated with a high reliability value (e.g., bits of the reconstructed codeword X associated with bits of the combined reliability information having a "1" value), "OR" represents a bitwise OR operation, and "AND" represents a bitwise AND operation. The erased bits $T_e$ of the target codeword T and the other undecodable codewords may be determined during performance of the single codeword erasure decoding operations (at 704) or in any other manner. The erased bits $X_e$ of the reconstructed codeword X may be determined by combining the erased bits of each undecodable codeword used to generate the reconstructed codeword. In a particular implementation, the erased bits of the undecodable codewords used to generate the reconstructed codeword X are combined using an AND operation to generate the erased bits $X_e$.

The controller may generate a corrected codeword $D_h$ (e.g., a replacement codeword, such as the replacement codeword 576 of FIG. 5 as a non-limiting example) by selectively replacing one or more bits of the target codeword T with one or more bits of the reconstructed codeword X based on the reliability parameter A. For example, the corrected codeword $D_h$ may be generated according to Equation 2 as follows:

$$D_h = (X_h \text{ AND } A) \text{ OR } (T_h \text{ AND } (\sim A)) \quad \text{(Eq. 2)}$$

where $X_h$ is the reconstructed codeword X (e.g., hard bits of the reconstructed codeword X), $T_h$ is the target codeword T (e.g., hard bits of the target codeword T), and $\sim A$ is the inverse (e.g., complement) of the reliability parameter A.

The controller may generate erased bits $D_e$ of the corrected codeword $D_h$ by combining the erased bits $T_e$ of the target codeword T and the erased bits $X_e$ of the reconstructed codeword X. For example, the erased bits $D_e$ may be generated according to Equation 3 as follows:

$$D_e = T_e \text{ AND } X_e \quad \text{(Eq. 3)}$$

where $T_e$ indicates the erased bits of the target codeword T, and $X_e$ indicates the erased bits of the reconstructed codeword X.

After generating the corrected codeword $D_h$ and the erased bits $D_e$, the controller may perform an erasure decoding operation on the corrected codeword $D_h$ and the erased bits $D_e$, and the method 700 may continue to 710, where a determination is made as to whether the erasure decoding operation is successful. If the erasure decoding operation is not successful, the method 700 continues to 714, where the value of the first parameter j is modified such that j=(j+1) mod m (where "mod" represents a modulo operation). After modifying the value of the first parameter j, the method 700 continues to 724, where a determination is made as to whether the value of the first parameter j is equal to 0. The value of the first parameter j may be equal to 0 when a particular iteration of the iterative process is complete (e.g., at the beginning of a next iteration). If the value of the first parameter j is not equal to 0, the method 700 continues to 708, and a combined reliability erasure decoding is performed on the next undecodable codeword. If the value of the first parameter j is equal to 0, an additional determination is performed, as further described herein.

Returning to 710, if the combined reliability erasure decoding operation is successful, the method 700 continues to 712, where the XOR buffer (e.g., the buffer that stores the accumulated XOR value of the decoded codewords in the XOR stripe) is updated to include the contribution of the decoded codeword (e.g., by XORing the XOR buffer contents with the decoded codeword). The value of the second parameter n may be modified such that n=m. After modifying the value of the second parameter n, the value of m may be modified such that m=m−1. A XOR indication buffer may also be updated. The XOR indication buffer may store indications of which retrieved codewords in the buffer (e.g., the XOR buffer) are undecodable. For example, the XOR indication buffer may be updated to indicate that the jth undecodable codeword is no longer undecodable. The value of the first parameter j is also modified such that j=(j+1) mod m. After modifying the value of the first parameter j, the method 700 continues to 716.

The method 700 includes determining whether a target codeword is able to be decoded, at 716. The target codeword may be any one of the multiple undecodable codewords, and the method 700 may be performed in order to enable decoding of the target codeword. The target codeword may be the same or different than the target codeword T at 708. The target codeword may be decoded by a previously performed combined reliability erasure decoding (at 708), by an ECC decoder (e.g., the ECC decoder 554 of FIG. 5), or by a stripe decoder (e.g., the stripe decoder 556 of FIG. 5) based on other retrieved codewords from a corresponding stripe and the retrieved codewords stored in the buffer (one or more of which may have been modified at 708). If the target codeword is decodable, the method 700 ends, at 718.

If the target codeword is not decodable, the method 700 continues to 724, where a determination whether the value of the first parameter j is equal to 0 is performed. The value of the first parameter j may be equal to 0 when a particular iteration of the iterative process is complete (e.g., at the beginning of a next iteration). If the value of the first parameter j is not equal to 0 (e.g., a particular iteration is not complete), the method 700 continues to 708, and a combined reliability erasure decoding is performed on the next undecodable codeword.

If the value of the first parameter j is equal to 0 (e.g., a particular iteration is complete), the method 700 continues to 720, where a determination whether a value of the second parameter n is equal to m is performed. The value of n may be equal to m if no undecodable retrieved codeword is modified during the particular iteration (e.g., if the combined reliability erasure decoding for each undecodable codeword fails). If the value of the second parameter n is not equal to m, the method 700 continues to 706, where the value of the second parameter n is modified such that n=m, and a next iteration is performed. If the value of the second parameter n is equal to m, then no undecodable codeword was modified during the particular iteration. In this situation, the method 700 continues to 722, where failure is declared (e.g., an error condition is output), and the method 700 ends, at 718.

Thus, the method 700 performs an iterative process to modify (e.g., correct) one or more undecodable codewords. Modifying the undecodable codewords may enable a target codeword to be decoded (e.g., using an ECC decoder or a stripe decoder). Thus, the method 700 may enable decoding of one or more codewords that may otherwise be undecodable by conventional decoding processes.

Figure 8:
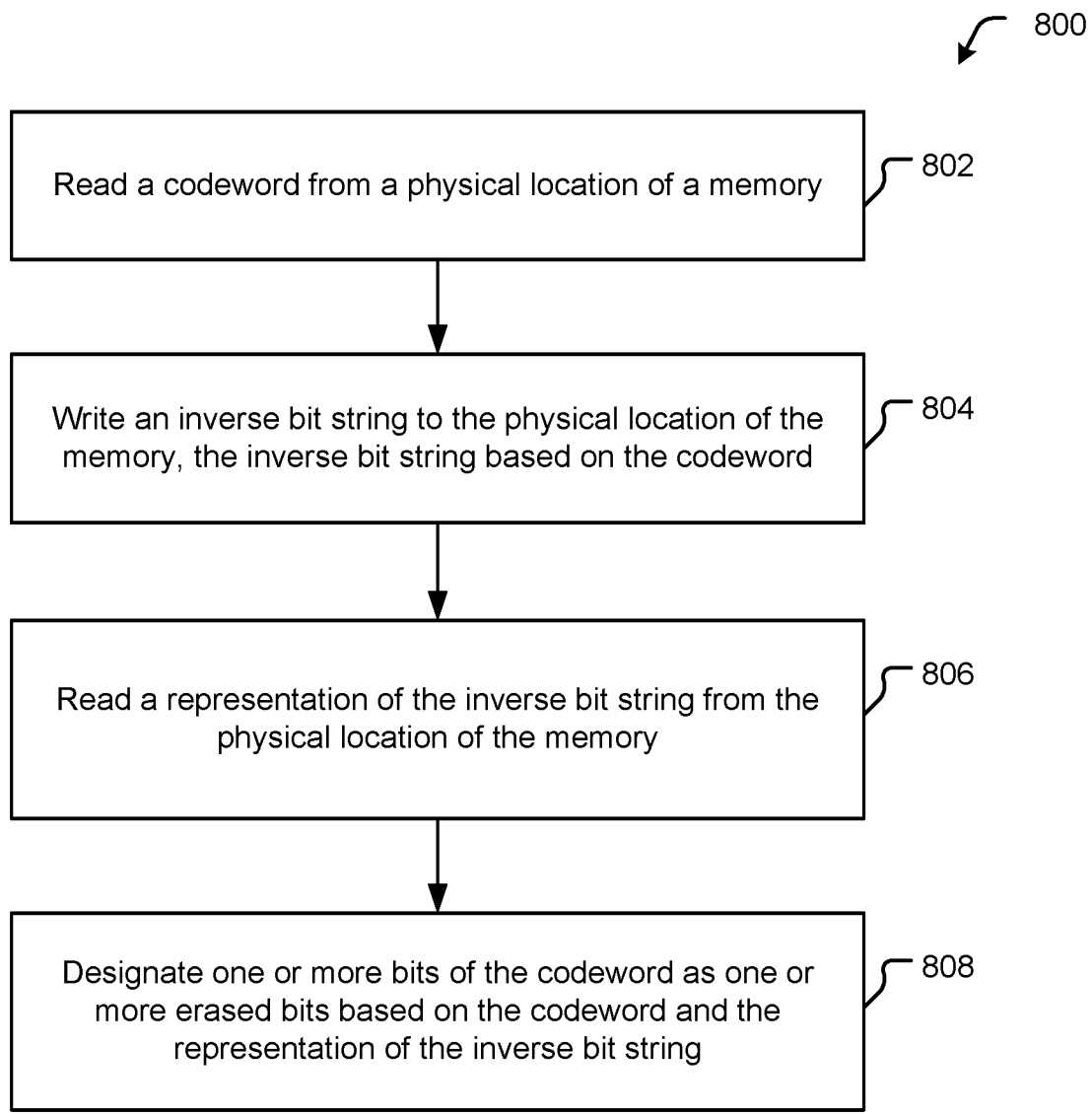
FIG. 8 is a flow diagram of another particular example of a method of decoding data that may be performed by the data storage device of FIG. 5.

Referring to FIG. 8, a particular illustrative example of a method of decoding data is depicted and generally designated 800. The method 800 may be performed at a data storage device, such as at the data storage device 502 of FIG. 5. One or more operations of the method 800 may be performed or initiated by the controller 530, such as in response to a read request from the access device 570 of FIG. 5.

The method 800 includes reading a codeword from a physical location of a memory, at 802. For example, the codeword may include or correspond to the first codeword 560 (a representation of which is received at the controller 530 as the first retrieved codeword 561) of FIG. 5, and the memory may include or correspond to the memory 504 of FIG. 5. In a particular implementation, the memory includes a storage-class memory.

The method 800 also includes writing an inverse bit string to the physical location of the memory, at 804. The inverse bit string is based on the codeword. For example, the inverse bit string may include or correspond to the inverse bit string 584 of FIG. 5. In a particular implementation, a value of each bit of the inverse bit string is inverted with respect to a value of a corresponding bit of the codeword, as illustrated in FIG. 6. Additionally, or alternatively, the inverse bit string may be generated and written to the memory in response to a decoding failure associated with the codeword, and the inverse bit string may overwrite the codeword at the memory, as illustrated in FIG. 6.

The method 800 also includes reading a representation of the inverse bit string from the physical location of the memory, at 806. For example, the representation of the inverse bit string may include or correspond to the retrieved inverse bit string 586 (e.g., a representation of the inverse bit string 584) of FIG. 5.

The method 800 further includes designating one or more bits of the codeword as one or more erased bits based on the codeword and the representation of the inverse bit string, at 808. For example, the one or more erased bits may include or correspond to the erased bits 572 of FIG. 5.

In a particular implementation, the method 800 further includes performing a XOR operation on the codeword and the representation of the inverse bit string to determine the one or more erased bits. For example, the data combiner 590 may perform a XOR operation on the first retrieved codeword 561 and the retrieved inverse bit string 586 to generate the combined bit string 571, and the erase bit designator 592 may designate the erased bits 572 based on the combined bit string 571, as described with reference to FIG. 5. The one or more erased bits may correspond to one or more bits that have the same value in the codeword and the representation of the inverse bit string, as described with reference to FIGS. 5 and 6.

In a particular implementation, the method 800 includes decoding (e.g., initiating a decoding operation with respect to) the codeword and a modified codeword to generate user data. At least one of the one or more erased bits in the codeword has a different value than a corresponding bit in the modified codeword. To illustrate, the modified codeword may be generated by inverting (e.g., complementing) a corresponding value of each bit of the one or more erased bits in the codeword, as illustrated in FIG. 6. The modified codeword may include or correspond to the modified codeword 573 of FIG. 5, and the user data may include or correspond to the data 582 of FIG. 5 that is generated in response to decoding the first retrieved codeword 561 or the modified codeword 573, as described with reference to FIG. 5. In a particular implementation, decoding the codeword and the modified codeword includes performing erasure decoding based on the one or more erased bits to decode the codeword and the modified codeword, as described with reference to FIG. 5.

Thus, the method 800 enables determination one or more erased bits of a retrieved codeword by reading a representation of the codeword (e.g., the retrieved codeword) from a particular physical location of a memory, writing an inverse bit string to the particular physical location, reading a representation of the inverse bit string from the memory, and comparing the retrieved codeword and the retrieved inverse bit string. In this manner, erased bits may be determined using as few as two additional commands or operations to a memory (e.g., a write command to write the inverse bit string and a read command to read the representation of the inverse bit string). The erased bits may be used to perform erasure decoding operations on the codeword and a modified codeword. One of the two erasure decoding operations may be more likely to succeed (e.g., to generate decoded data) than a conventional ECC decoding operation or a stripe decoding operation.

Figure 9:
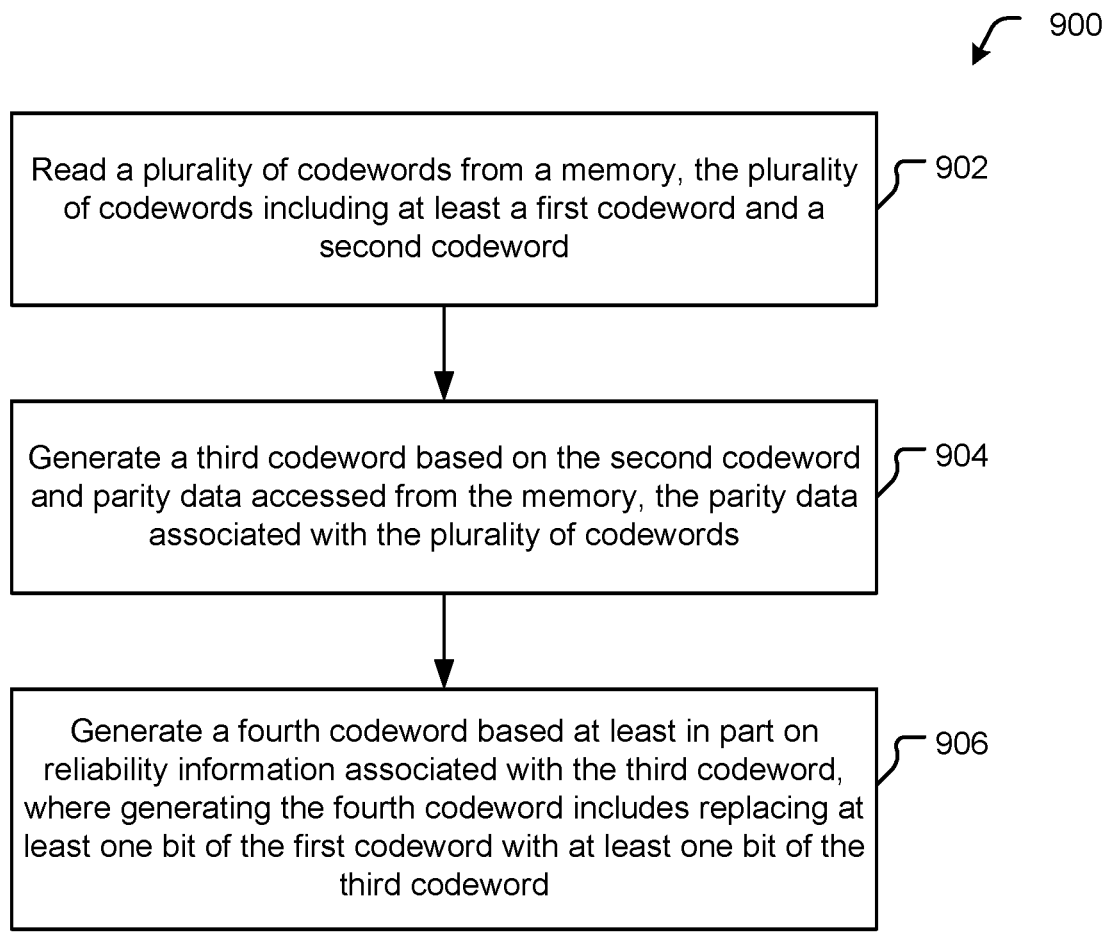
FIG. 9 is a flow diagram of another particular example of a method of decoding data that may be performed by the data storage device of FIG. 5.

Referring to FIG. 9, a particular illustrative example of a method of decoding data is depicted and generally designated 900. The method 900 may be performed at a data storage device, such as at the data storage device 502 of FIG. 5. One or more operations of the method 900 may be performed or initiated by the controller 530, such as in response to a read request from the access device 570 of FIG. 5.

The method 900 includes reading a plurality of codewords from a memory, at 902. The plurality of codewords includes at least a first codeword and a second codeword. For example, the plurality of codewords may include the first codeword 560 and the second codeword 562, and representations of the plurality of codewords may be stored at the memory 538 of the controller 530 as the first retrieved codeword 561 and the second retrieved codeword 563, as described with reference to FIG. 5.

The method 900 also includes generating a third codeword based on the second codeword and parity data accessed from the memory, at 904. The parity data is associated with the plurality of codewords. For example, the parity data may include or correspond to the parity codeword 566 of FIG. 5, which is stored at the memory 538 as the retrieved parity codeword 567, and the third codeword may include or correspond to the reconstructed codeword 574 of FIG. 5. In a particular implementation, generating the third codeword includes performing a XOR operation with respect to the second codeword and the parity data. For example, the data combiner 590 may perform a XOR operation on the second retrieved codeword 563 (and any other retrieved codewords of a corresponding stripe that are stored at the memory 538) and the retrieved parity codeword 567 to generate the reconstructed codeword 574.

The method 900 further includes generating a fourth codeword based at least in part on reliability information associated with the third codeword, at 906. Generating the fourth codeword may include replacing at least one bit of the first codeword with at least one bit of the third codeword. For example, the fourth codeword may include or correspond to the replacement codeword 576 (e.g., a replacement codeword) of FIG. 5, and the reliability information may include or correspond to the combined reliability information 575 of FIG. 5.

In a particular implementation, the method 900 includes performing one or more read operations associated with the second codeword to generate second reliability information associated with the second codeword. The plurality of codewords includes a fifth codeword. For example, the fifth codeword may include or correspond to the $S^{th}$ codeword 564 (which is stored at the memory 538 as the St retrieved codeword 565) of FIG. 5, and the second reliability information may include or correspond to the second reliability information 588 of FIG. 5. One or more read operations associated with the fifth codeword are performed to generate third reliability information associated with the fifth codeword. For example, the third reliability information may include or correspond to the $S^{th}$ reliability information 589 of FIG. 5. An AND operation is performed with respect to the second reliability information and the third reliability information to generate the reliability information associated with the third codeword. For example, an AND operation may be performed on the second reliability information 588 and the $S^{th}$ reliability information 589 to generate the combined reliability information 575, as described with reference to FIG. 5.

In a particular implementation, the method 900 includes performing erasure decoding on the fourth codeword based on a designation of one or more erased bits in the first codeword and a designation of one or more erased bits in the third codeword. For example, an erasure decoding operation may be performed on the replacement codeword 576 of FIG. 5. The erased bits associated with the replacement codeword 576 may be based on the erased bits 572 (e.g., erased bits associated with the first retrieved codeword 561) and erased bits associated with the reconstructed codeword 574, as further described with reference to FIG. 7. The method 900 may further include storing the first codeword, the second codeword, and the parity data in a buffer prior to generating the third codeword and replacing the first codeword in the buffer with the fourth codeword based on a successful erasure decoding of the fourth codeword. For example, the buffer may include or correspond to the memory 538 of FIG. 5. As described with reference to FIG. 5, the first retrieved codeword 561, the second retrieved codeword 563, and the retrieved parity codeword 567 may be stored in the memory 538 prior to generating the reconstructed codeword 574, and the first retrieved codeword 561 may be replaced with the replacement codeword 576 in response to a successful erasure decoding of the replacement codeword 576.

Generating the third codeword, generating the fourth codeword, and replacing the first codeword with the fourth codeword may be performed during a first iteration of a decoding process of the plurality of codewords. For example, generating the reconstructed codeword X, generating the replacement codeword $D_h$, and replacing an undecodable codeword with the replacement codeword $D_h$ may be performed during a particular iteration of an iterative decoding process, as described with reference to FIG. 7.

Each iteration of the decoding process may include, for each codeword stored at the buffer that is undecodable by an error correction code (ECC) decoder, selectively modifying one or more bits of the codeword based at least in part on reliability information associated with other codewords stored at the buffer. For example, the replacement codeword $D_h$ may be generated in accordance with Equation 2 (e.g., based at least in part on the reliability parameter A), as described with reference to FIG. 7. Iterations of the decoding process are performed until a target codeword of the plurality of codewords is decodable by the ECC decoder or until no codewords stored at the buffer are modified during a particular iteration, as described with reference to FIG. 7.

Thus, the method 900 performs an iterative process to modify (e.g., correct) one or more undecodable retrieved codewords. Modifying the undecodable retrieved codewords may enable a target retrieved codeword to be decoded (e.g., using an ECC decoder or a stripe decoder). Thus, the method 900 may enable decoding of one or more retrieved codewords that may otherwise be undecodable by conventional decoding processes.

The method 700 of FIG. 7, the method 800 of FIG. 8, the method 900 of FIG. 9, or a combination thereof, may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 700 of FIG. 7, the method 800 of FIG. 8, the method 900 of FIG. 9, or a combination thereof, can be initiated or controlled by one or more processors, such as one or more processors included in or coupled to a controller or a memory of the data storage device 502 and/or the access device 570 of FIG. 5. As an example, the method 700 of FIG. 7, the method 800 of FIG. 8, the method 900 of FIG. 9, or a combination thereof, individually or in combination, may be performed by the controller 530 of FIG. 5. To illustrate, a portion of the method 700 of FIG. 7, a portion of the method 800 of FIG. 8, or a portion of the method 900 of FIG. 9 may be combined with other operations described herein. Additionally, one or more operations described with reference to FIGS. 7, 8, and 9 may be optional, may be performed at least partially concurrently, and/or may be performed in a different order than shown or described.

In an illustrative example, a processor may be programmed to decode data read from a memory of a data storage device. For example, the processor may execute instructions to read a codeword from a physical location of the memory. The processor may execute instructions to write an inverse bit string to the physical location of the memory. The inverse bit string may be based on the codeword. The processor may execute instructions to read a representation of the inverse bit string from the physical location of the memory. The processor may further execute instructions to designate one or more bits of the codeword as one or more erased bits based on the codeword and the representation of the inverse bit string.

As another illustrative example, a processor may be programmed to decode data read from a memory of a data storage device. For example, the processor may execute instructions to read a plurality of codewords from the memory. The plurality of codewords may include at least a first codeword and a second codeword. The processor may execute instructions to generate a third codeword based on the second codeword and parity data accessed from the memory. The parity data may be associated with the plurality of codewords. The processor may further execute instructions to generate a fourth codeword based at least in part on reliability information associated with the third codeword. Generating the fourth codeword includes replacing at least one bit of the first codeword with at least one bit of the third codeword.

Although the controller 530 and certain other components described herein are illustrated as block components and described in general terms, such components may include one or more microprocessors, state machines, and/or other circuits configured to enable the data storage device 502 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 502 to perform one or more operations described herein.

Alternatively, or in addition, one or more aspects of the data storage device 502 may be implemented using a microprocessor or microcontroller programmed (e.g., by executing instructions) to perform one or more operations described herein, such as one or more operations of the methods 700-900. In a particular embodiment, the data storage device 502 includes a processor executing instructions (e.g., firmware) retrieved from the memory device 503. Alternatively, or in addition, instructions that are executed by the processor may be retrieved from memory separate from the memory device 503, such as at a read-only memory (ROM) that is external to the memory device 503.

In conjunction with the described aspects, an apparatus includes means for designating erased bits of a first codeword read from a physical location of a means for storing data based on at least the first codeword and a second codeword read from the physical location of the means for storing data after performance of a write command associated with an inverse bit string at the physical location. The inverse bit string is based on the first codeword. For example, the means for designating may include the erase bit designator 592 or the controller 530 of FIG. 5, one or more other devices, circuits, or instructions to designate erased bits of a first codeword, or a combination thereof. The means for storing may include or correspond to the memory device 503 or the memory 504 of FIG. 5, one or more other devices, circuits, or instructions to store data, or a combination thereof.

The apparatus also includes means for erasure decoding at least the first codeword based on the erased bits. For example, the means for erasure decoding may include the ECC decoder 554, the stripe decoder 556, the ECC engine 536, or the controller 530 of FIG. 5, one or more other devices, circuits, or instructions to designate erased bits of a first codeword, or a combination thereof.

In a particular implementation, the means for erasure decoding is further configured to erasure decode a modified first codeword. Values of the erased bits of the first codeword may be values of corresponding bits of the modified first codeword. For example, the means for erasure decoding may perform erasure decoding on the first retrieved codeword 561 and the modified codeword 573, as described with reference to FIG. 5.

In another particular implementation, the means for designating is further configured to designate the erased bits as part of an iterative process to decode at least one undecodable codeword of a plurality of codewords read from the means for storing data based on the plurality of codewords, reliability information associated with the plurality of codewords, and parity data associated with the plurality of codewords. For example, the means for designating may designate the erased bits 572 as part of an iterative process, such as the method 700 described with reference to FIG. 7.

It should be appreciated that one or more operations described herein as being performed by the controller 530 may be performed at the memory device 503. As an illustrative example, in-memory ECC operations (e.g., encoding operations and/or decoding operations) may be performed at the memory device 503 alternatively or in addition to performing such operations at the controller 530.

To further illustrate, the data storage device 502 may be configured to be coupled to the access device 570 as embedded memory, such as in connection with an embedded MultiMedia Card (eMMC®) (trademark of JEDEC Solid State Technology Association, Arlington, Va.) configuration, as an illustrative example. The data storage device 502 may correspond to an eMMC device. As another example, the data storage device 502 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 502 may operate in compliance with a JEDEC industry specification. For example, the data storage device 502 may operate in compliance with a JEDEC eMMC specification, a JEDEC Universal Flash Storage (UFS) specification, one or more other specifications, or a combination thereof.

The memory device 503 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory device 503 may include another type of memory. In a particular embodiment, the data storage device 502 is indirectly coupled to an access device (e.g., the access device 570) via a network. For example, the data storage device 502 may be a network-attached storage (NAS) device or a component (e.g., a solid-state drive (SSD) component) of a data center storage system, an enterprise storage system, or a storage area network. The memory device 503 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
   a memory; and
   a controller coupled to the memory, wherein the controller is configured to:
      read a codeword from a physical location of the memory,
      write an inverse bit string to the physical location of the memory, the inverse bit string based on the codeword,
      read a representation of the inverse bit string from the physical location of the memory, and
      designate one or more bits of the codeword as one or more erased bits based on the codeword and the representation of the inverse bit string.

2. The device of claim 1, wherein a value of each bit of the inverse bit string is inverted with respect to a value of a corresponding bit of the codeword.

3. The device of claim 1, wherein the inverse bit string is generated and written to the memory in response to a decoding failure associated with the codeword, the inverse bit string overwriting the codeword at the memory.

4. The device of claim 1, wherein the controller is further configured to perform an exclusive-or (XOR) operation on the codeword and on the representation of the inverse bit string to determine the one or more erased bits.

5. The device of claim 4, wherein the one or more erased bits correspond to one or more bits that have the same value in the codeword and in the representation of the inverse bit string.

6. The device of claim 1, further comprising a decoder configured to decode the codeword and a modified codeword to generate user data, wherein at least one of the one or more erased bits in the codeword has a different value than a corresponding bit in the modified codeword.

7. The device of claim 6, wherein the decoder is further configured to perform erasure decoding based on the one or more erased bits to decode the codeword and the modified codeword.

8. The device of claim 6, wherein the controller is further configured to generate the modified codeword by inverting a corresponding value of each bit of the one or more erased bits in the codeword.

9. The device of claim 6, wherein the decoder comprises a Bose-Chaudhuri-Hocquenghem (BCH) decoder.

10. The device of claim 1, wherein the memory comprises a storage-class memory.

11. A method performed by a controller of a data storage device, the method comprising:
   reading a plurality of codewords from a memory, the plurality of codewords including at least a first codeword and a second codeword;

generating a third codeword based on the second codeword and parity data accessed from the memory, the parity data associated with the plurality of codewords; and generating a fourth codeword based at least in part on reliability information associated with the third codeword, wherein generating the fourth codeword includes replacing at least one bit of the first codeword with at least one bit of the third codeword.

12. The method of claim 11, wherein generating the third codeword comprises performing an exclusive-or (XOR) operation with respect to the second codeword and the parity data.

13. The method of claim 11, further comprising:

performing one or more read operations associated with the second codeword to generate second reliability information associated with the second codeword, wherein the plurality of codewords includes a fifth codeword;

performing one or more read operations associated with the fifth codeword to generate third reliability information associated with the fifth codeword; and performing an AND operation with respect to the second reliability information and the third reliability information to generate the reliability information associated with the third codeword.

14. The method of claim 11, further comprising performing erasure decoding on the fourth codeword based on a designation of one or more erased bits in the first codeword and a designation of one or more erased bits in the third codeword.

15. The method of claim 14, further comprising:

storing the first codeword, the second codeword, and the parity data in a buffer prior to generating the third codeword; and replacing the first codeword in the buffer with the fourth codeword based on a successful erasure decoding of the fourth codeword.

16. The method of claim 15, wherein:

generating the third codeword, generating the fourth codeword, and replacing the first codeword with the fourth codeword are performed during a first iteration of a decoding process of the plurality of codewords, and each iteration of the decoding process includes, for each codeword stored at the buffer that is undecodable by an error correction code (ECC) decoder, selectively modifying one or more bits of the codeword based at least in part on reliability information associated with other codewords stored at the buffer.

17. The method of claim 16, wherein iterations of the decoding process are performed until a target codeword of the plurality of codewords is decodable by the ECC decoder or until no codewords stored at the buffer are modified during a particular iteration.

18. An apparatus comprising:

means for designating erased bits of a first codeword read from a physical location of a means for storing data based on at least the first codeword and a second codeword read from the physical location of the means for storing data after performance of a write command associated with an inverse bit string at the physical location, the inverse bit string based on the first codeword; and means for erasure decoding at least the first codeword based on the erased bits.

19. The apparatus of claim 18, wherein:

the means for erasure decoding is further configured to erasure decode a modified first codeword, and values of the erased bits of the first codeword are inverses of values of corresponding bits of the modified first codeword.

20. The apparatus of claim 18, wherein the means for designating is further configured to designate the erased bits as part of an iterative process to decode at least one undecodable codeword of a plurality of codewords read from the means for storing data based on the plurality of codewords, reliability information associated with the plurality of codewords, and parity data associated with the plurality of codewords.

* * * * *